(12) United States Patent
Watanabe

(10) Patent No.: US 8,759,192 B2
(45) Date of Patent: Jun. 24, 2014

(54) SEMICONDUCTOR DEVICE HAVING WIRING AND CAPACITOR MADE BY DAMASCENE METHOD AND ITS MANUFACTURE

(75) Inventor: Kenichi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/613,961

(22) Filed: Sep. 13, 2012

(65) Prior Publication Data

US 2013/0011995 A1    Jan. 10, 2013

Related U.S. Application Data

(62) Division of application No. 11/507,438, filed on Aug. 22, 2006, now abandoned.

(30) Foreign Application Priority Data

Jan. 16, 2006   (JP) .................................. 2006-007658

(51) Int. Cl.
*H01L 21/02*  (2006.01)
*H01L 23/522*  (2006.01)

(52) U.S. Cl.
CPC .................................. *H01L 23/5223* (2013.01)
USPC .... 438/386; 438/387; 257/301; 257/E21.579; 257/E21.651; 257/E21.346

(58) Field of Classification Search
None
See application file for complete search history.

(56) References Cited

U.S. PATENT DOCUMENTS 5,708,559 A    1/1998  Brabazon et al.
6,008,083 A    12/1999 Brabazon et al.
(Continued)

FOREIGN PATENT DOCUMENTS

EP    0771022       5/1997
JP    9-181258 A    7/1997
(Continued)

OTHER PUBLICATIONS

USPTO, [KALAM] "U.S. Appl. No. 11/507,438 (pending)," [CTRS] Requirement for Restriction/Election issued on Mar. 11, 2009.

(Continued)

*Primary Examiner* — Matthew W Such
*Assistant Examiner* — Abul Kalam
(74) *Attorney, Agent, or Firm* — Fujitsu Patent Center

(57) ABSTRACT

A wiring trench is formed in an interlayer insulating film partway in the depth direction of the interlayer insulating film. A via hole is formed extending from the bottom of the wiring trench to the bottom of the interlayer insulating film. A capacitor recess is formed reaching the bottom of the interlayer insulating film. A conductive member is embedded in the wiring trench and via hole. A capacitor is embedded in the capacitor recess, including a lower electrode, a capacitor dielectric film and an upper electrode. The lower electrode is made of the same material as that of the conductive member and disposed along the bottom and side surface of the capacitor recess. A concave portion is formed on an upper surface of the lower electrode, and the capacitor dielectric film covers an inner surface of the concave portion. The upper electrode is embedded in the concave portion.

7 Claims, 26 Drawing Sheets

(56) References Cited

U.S. PATENT DOCUMENTS

| | | | |
|---|---|---|---|
| 6,417,575 | B2 | 7/2002 | Harada et al. |
| 6,451,688 | B1 | 9/2002 | Shimpuku |
| 6,452,251 | B1 | 9/2002 | Bernstein et al. |
| 6,734,489 | B2 | 5/2004 | Morimoto et al. |
| 6,767,788 | B2 | 7/2004 | Kim |
| 6,794,262 | B2 | 9/2004 | Ning et al. |
| 7,169,680 | B2 | 1/2007 | Yang et al. |
| 7,220,652 | B2 | 5/2007 | Kim et al. |
| 7,332,764 | B2 | 2/2008 | Choi et al. |
| 2002/0155676 | A1 | 10/2002 | Stetter et al. |
| 2003/0060052 | A1* | 3/2003 | Kim et al. ............ 438/694 |
| 2004/0009640 | A1* | 1/2004 | Saran ............ 438/240 |
| 2006/0043452 | A1* | 3/2006 | Ueda et al. ............ 257/310 |
| 2006/0189090 | A1* | 8/2006 | Yang et al. ............ 438/386 |

FOREIGN PATENT DOCUMENTS

| | | |
|---|---|---|
| JP | 2001-177076 A | 6/2001 |
| JP | 2002-170885 A | 6/2002 |
| JP | 2003-86695 A | 3/2003 |
| JP | 2003-086695 A | 3/2003 |
| JP | 2005-51247 A | 2/2004 |
| JP | 2005-354080 A | 12/2005 |

OTHER PUBLICATIONS

USPTO, [KALAM] "U.S. Appl. No. 11/507,438 (pending)," [CTRS] Requirement for Restriction/Election issued on Jul. 8, 2009.

USPTO, [KALAM] "U.S. Appl. No. 11/507,438 (pending)," [CTNF] Non-Final Rejection issued on Oct. 8, 2009.

USPTO, [KALAM] "U.S. Appl. No. 11/507,438 (pending)," [CTNF] Non-Final Rejection issued on Nov. 29, 2010.

USPTO, [KALAM] "U.S. Appl. No. 11/507,438 (pending)," [CTNF] Non-Final Rejection issued on Dec. 22, 2011.

USPTO, [KALAM] "U.S. Appl. No. 11/507,438 (pending)," [CTFR] Final Rejection issued on Jun. 10, 2010.

USPTO, [KALAM] "U.S. Appl. No. 11/507,438 (pending)," [CTFR] Final Rejection issued on Jul. 6, 2011.

USPTO, [KALAM] "U.S. Appl. No. 11/507,438 (pending)," [CTFR] Final Rejection issued on May 24, 2012.

Japanese Office mailed by JPO and corresponding to Japanese Application No. 2006-007658 on Aug. 23, 2011, with English-language Translation.

USPTO, [KALAM] "U.S. Appl. No. 11/507,438 (pending)," [CTNF] Non-Final Rejection issued on Dec. 17, 2012.

USPTO, [KALAM], "U.S. Appl. No. 11/507,438 (related)," [CTFR] Final Rejection issued on Jul. 5, 2013 (pending).

* cited by examiner

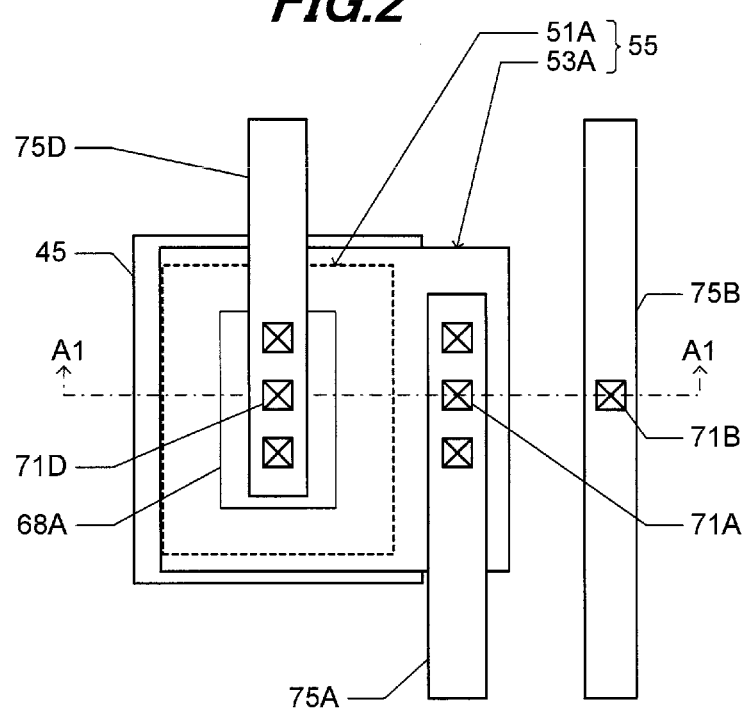

SEMICONDUCTOR DEVICE HAVING WIRING AND CAPACITOR MADE BY DAMASCENE METHOD AND ITS MANUFACTURE

CROSS REFERENCE TO RELATED APPLICATION

This application is a Divisional of U.S. application Ser. No. 11/507,438 filed on Aug. 22, 2006, which is based on and claims priority of Japanese Patent Application No. 2006-007658 filed on Jan. 16, 2006, the entire contents of which are incorporated herein by reference.

BACKGROUND OF THE INVENTION

A) Field of the Invention

The present invention relates to a semiconductor device and its manufacture method, and more particularly to a semiconductor device having wirings formed by a damascene method and capacitors and its manufacture method.

B) Description of the Related Art

Generally, a high frequency analog integrated circuit used in a mobile communication field or the like requires passive elements such as resistors, capacitors and inductors in addition to active elements (transistors and the like) operable at high speed, because of the characteristics of signals to be processed. In order to improve an operation speed and reduce a consumption power, it is necessary to reduce parasitic capacitance and resistance. In order to reduce parasitic capacitance and resistance, a capacitor of a metal-insulator-metal (MIM) structure is used more than a capacitor of a metal-oxide-semiconductor (MOS) structure.

FIG. 16 is a cross sectional view of a semiconductor device having wirings formed by a damascene method and capacitors of a MIM structure. In the following, a manufacture method for the semiconductor device shown in FIG. 16 will be described.

An etching stopper film 101 of SiN and an interlayer insulating film 102 of $SiO_2$ are formed on an interlayer insulating film 100. A wiring trench is formed through these two films and a copper wiring 103 is embedded in this wiring trench. On the interlayer insulating film 102, an etching stopper film 106 of SiN is formed, the etching stopper film 106 serving as a film for preventing copper diffusion and for stopping progress of etching. A thin $SiO_2$ film 112 is formed on the etching stopper film 106. This $SiO_2$ film 112 is not essential. A recess 110 is formed reaching the upper surface of the interlayer insulating film 100.

A TiN film as a lower electrode 115A, an $SiO_2$ film as a capacitor dielectric film 116A, a TiN film as an upper electrode 117A and an SiN film as an upper insulating film 118A are sequentially deposited on the whole surface of the substrate. These four layers are deposited also on the inner surface of the recess 110. The four layers from the lower side TiN film to the SiN film are patterned in a shape of the lower electrode 115A. In this case, the recess 110 is used as an alignment mark. Since the upper surface of the interlayer insulating film 102 is flat, the position of the lower level wiring 103 cannot be detected after the TiN film is formed on the interlayer insulating film 102. The recess 110 is therefore formed to use it as the alignment mark.

Next, the $SiO_2$ film, upper level TiN film and SiN film are patterned in a shape of the upper electrode 117A. A capacitor 119 is constituted of the lower electrode 115A of TiN, capacitor dielectric film 116A of $SiO_2$, and upper electrode 117A of TiN. The TiN film 115B, $SiO_2$ film 116B, upper TiN film 117B and SiN film 118B are also left on the inner surface of the recess 110.

An interlayer insulating film 120 is formed covering the capacitor 119, and the surface of the interlayer insulating film 120 is planarized. Via holes 122A, 122B and 122C are formed through the interlayer insulating film 120. The via hole 122A passes beside the upper electrode 117A and exposes the upper surface of the lower electrode 115A. The via hole 122B passes through the upper insulating film 118A and exposes the upper surface of the upper electrode 117A. The via hole 122C passes through the $SiO_2$ film 112 and etching stopper film 106 and exposes the upper surface of the lower level wiring 103.

After the inner surfaces of these via holes 122A, 122B and 122C are covered with a barrier metal film, plugs made of tungsten (W) are embedded in the via holes. Wirings 125A, 125B and 125C of aluminum (Al) or the like are formed on the interlayer insulating film 120. The wirings 125A, 125B and 125C are connected to the plugs embedded in the via holes 122A, 122B and 122C, respectively.

With the above-described manufacture method, it is necessary to conduct photolithography once at each of the process of forming the recess 110, the process of patterning the lower electrode 115A and the process of patterning the upper electrode 117A. Namely, three photolithography processes are newly added as compared to the case in which the capacitor 119 is not formed.

With reference to FIGS. 17A to 17E, description will be made on a capacitor manufacture method disclosed in JP-A-2005-51247.

As shown in FIG. 17A, a conductor 151 is buried in a recess formed in a surface region of an interlayer insulating film 150. Another interlayer insulating film 154 is formed on the interlayer insulating film 150. A recess 155 is formed in the interlayer insulating film 154. A partial upper surface of the lower level wiring 151 is exposed on the bottom surface of the recess 155. A barrier metal film 160 of Ta or the like, a capacitor dielectric film 161 of $SiO_2$ or the like and a barrier metal film 162 of Ta or the like are sequentially deposited on the interlayer insulating film 154 and on the inner surface of the recess 155. A conductive film 163 of Cu or the like is deposited on the barrier metal film 162 so that the recess 155 is completely filled with the conductive film 163.

As shown in FIG. 17B, chemical mechanical polishing (CMP) is preformed to expose the upper surface of the interlayer insulating film 154. The barrier metal film 160, capacitor dielectric film 161, barrier metal film 162 and conductive film 163 are left in the recess 155.

As shown in FIG. 17C, a wiring trench and via hole 156 is formed through the interlayer insulating film 154. A partial upper surface of the lower level wiring 151 is exposed on the bottom of the via hole 156.

As shown in FIG. 17D, the whole surface including the inner surface of the wiring trench and via hole 156 is covered with a barrier metal film 170, and a conductive film 171 is formed. The inside of the wiring trench and via hole 156 is filled with the conductive film 171.

As shown in FIG. 17E, CMP is performed until the upper surface of the interlayer insulating film 154 is exposed. A portion of the conductive film 171 is left in the wiring trench and via hole 156. A capacitor is therefore formed, having the lower level wiring 151 as a lower electrode and the conductive film 163 contained in the recess 155 as an upper electrode. The wiring 151 as the lower electrode is connected to another constituent element of an electric circuit via the conductive film 171 contained in the wiring trench and via hole 156.

With the method shown in FIGS. 17A to 17E, the photolithography process for forming the recess 155 shown in FIG. 17A is newly added as compared to the case in which the capacitor is not formed.

With reference to FIGS. 18A and 18B, description will be made on a capacitor manufacture method disclosed in JP-A-2003-86695.

As shown in FIG. 18A, on an interlayer insulating film 200, another interlayer insulating film 201 is formed. A wiring trench 206 and a capacitor groove 205 are formed in a surface layer of the interlayer insulating film 201. The capacitor groove 205 is wider than the wiring trench 206. A conductive film 210 is deposited under the condition that the inside of the wiring trench 206 is completely filled with the conductive film 210 and the inside of the capacitor groove 205 is partially filled with it. The surface of the conductive film 210 is covered with a capacitor dielectric film 211. An upper conductive film 212 is deposited on the capacitor dielectric film 211. The inside of the capacitor groove 205 is completely buried with the upper conductive film 212.

As shown in FIG. 18B, CMP is performed until the upper surface of the interlayer insulating film 201 is exposed. A lower electrode 210A consisting of a portion of the conductive film 210, a capacitor dielectric film 211A, and an upper electrode 212A consisting of a portion of the upper conductive film 212 are left in the capacitor groove 205, to form a capacitor 215. A wiring 210B consisting of a portion of the conductive film 210 is left in the wiring trench 206.

With the method shown in FIGS. 18A and 18B, it is not necessary to add a new photolithography process to form the capacitor 215.

SUMMARY OF THE INVENTION

In order to form the capacitor shown in FIG. 16, it is necessary to newly add three photolithography processes. In order to form the capacitor shown in FIGS. 17A to 17E, it is necessary to newly add one photolithography process.

The method of manufacturing the capacitor shown in FIGS. 18A and 18B do not require adding a new photolithography process. However, a distance between an outer border of the lower electrode 210A and an outer edge of the capacitor dielectric film 211A on the upper surface of the capacitor 215 depends on a thickness of the conductive film 210 shown in FIG. 18A. In order to contact a conductive plug to the exposed upper surface of the lower electrode 210A, it is necessary that the width of the lower electrode 210A has a sufficient margin relative to an alignment precision. If the conductive film 210 is made thick to make the width sufficiently wide, the capacitor groove 205 is completely filled with the conductive film 210 and a capacitor cannot be formed. It is therefore difficult to connect a lead wiring to the upper surface of the lower electrode 210A of the capacitor 215 having the structure shown in FIG. 18B. In order to connect a lead wiring to the lower electrode 210A with good reproductivity, the lead wiring is probably required to be in contact with the bottom of the lower electrode 210A.

An object of the present invention is to provide a semiconductor device having a capacitor structure having a high degree of freedom of a lead wiring structure and being able to be formed without adding a new photolithography process, and its manufacture method.

According to one aspect of the present invention, there is provided a semiconductor device comprising:

a first interlayer insulating film formed over a principal surface of a semiconductor substrate;

a first wiring trench formed in the first interlayer insulating film, a bottom of the first wiring trench not reaching a bottom of the first interlayer insulating film;

a first via hole formed in the first interlayer insulating film and extending from a bottom of the first wiring trench to the bottom of the first interlayer insulating film;

a capacitor recess formed in the first interlayer insulating film and reaching the bottom of the first interlayer insulating film;

a first conductive member embedded in the first wiring trench and the first via hole; and a capacitor embedded in the capacitor recess and including a lower electrode, a capacitor dielectric film and an upper electrode, wherein the lower electrode of the capacitor is made of a same material as a material of the first conductive member and disposed along a bottom surface and a side surface of the capacitor recess, a concave portion is formed on an upper surface of the lower electrode, the capacitor dielectric film covers an inner surface of the concave portion formed on the upper surface of the lower electrode, and the upper electrode is embedded in the concave portion.

According to another aspect of the present invention, there is provided a method of manufacturing a semiconductor device comprising steps of:

(a) forming a first interlayer insulating film over a semiconductor substrate;

(b) forming, in the first interlayer insulating film, a first wiring trench reaching partway in a depth direction of the first interlayer insulating film, a first via hole extending from a bottom of the first wiring trench to a bottom of the first interlayer insulating film and a capacitor recess extending from an upper surface to the bottom surface of the first interlayer insulating film;

(c) depositing a lower conductive film under a condition that the first wiring trench and the first via hole are fully filled with the lower conductive film and the lower conductive film has a thickness allowing an upper surface of the lower conductive film positions lower than the upper surface of the first interlayer insulating film in a partial area of the capacitor recess;

(d) forming a capacitor dielectric film over the lower conductive film;

(e) depositing an upper conductive film over the capacitor dielectric film;

(f) removing the lower conductive film, the capacitor dielectric film and the upper conductive film disposed above the upper surface of the first interlayer insulating film to leave a first conductive member consisting of a portion of the lower conductive film in the first wiring trench and in the first via hole and a capacitor in the capacitor recess, the capacitor being a lamination of a portion of the lower conductive film, a portion of the capacitor dielectric film and a portion of the upper conductive film.

A capacitor can be manufactured without adding a new photolithography process. By adjusting a thickness of the lower conductive film, it becomes possible to adjust a width of the upper surface of the capacitor lower electrode made of a portion of the lower conductive film.

BRIEF DESCRIPTION OF THE DRAWINGS

FIG. 2 is a plan view of the semiconductor device according to the first embodiment.

DESCRIPTION OF THE PREFERRED EMBODIMENTS

Figure 1A:
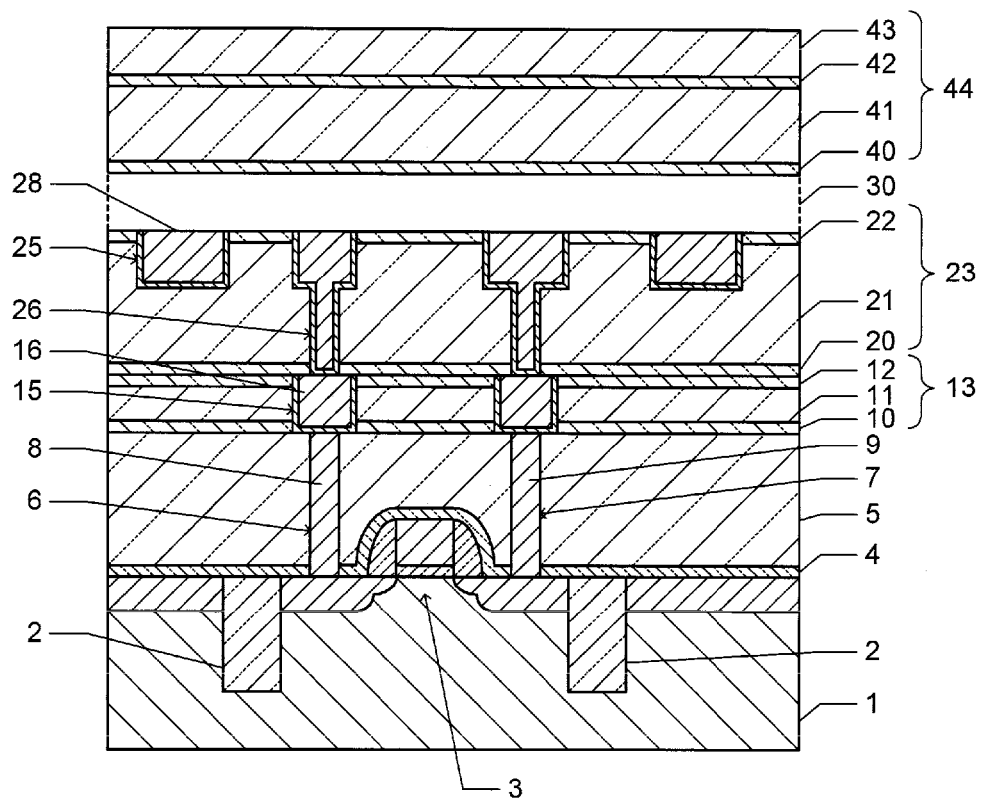
FIGS. 1A to 1O are cross sectional views of a semiconductor device during manufacture according to a first embodiment.

With reference to FIGS. 1A to 1Q, description will be made on a semiconductor device manufacture method according to the first embodiment.

As shown in FIG. 1A, an isolation insulating film 2 of a shallow trench isolation (STI) structure is formed in a surface layer of a semiconductor substrate 1 made of silicon. A MOSFET 3 is formed in an active region defined by the isolation insulating film 2. An etching stopper film 4 of SiN is formed on the surface of the semiconductor substrate 1, covering MOSFET 3. A first-layer interlayer insulating film 5 of phosphosilicate glass (PSG) or the like is formed on the etching stopper film 4. Via holes 6 and 7 are formed through the first-layer interlayer insulating film 5 and etching stopper film 4, and plugs 8 and 9 made of W or the like are embedded in the via holes 6 and 7, respectively. The plugs 8 and 9 are connected to the source region and the drain region of the MOSFET 3, respectively. The inner surfaces of the via holes 6 and 7 are covered with a barrier metal film of TiN or the like.

On the first-layer interlayer insulating film 5, a second-layer interlayer insulating film 13 is formed. The second-layer interlayer insulating film 13 consists of three layers: an etching stopper film 10 of SiC or the like, an insulating film 11 of SiOC or the like and a cap film 12 of SiO$_2$. A plurality of wiring trenches 15 are formed in the interlayer insulating film 13. The inner surfaces of the wiring trenches 15 are covered with barrier metal films of Ta or the like, and the insides of the wiring trenches 15 are filled with conductive members made of copper. The conductive members 16 in the wiring trenches 15 constitute first-layer wirings. The wiring trenches 15 and conductive members 16 are formed by a single damascene method.

On the second-layer interlayer insulating film 13, a third-layer interlayer insulating film 23 is formed. The third-layer interlayer insulating film 23 consists of three layers of an etching stopper film 20 of SiC or the like, an insulating film 21 of SiOC or the like and a cap film 22 of SiO$_2$. A plurality of wiring trenches 25 and via holes 26 are formed in the interlayer insulating film 23. The inner surfaces of the wiring trench 25 and via hole 26 are covered with a barrier metal film of Ta or the like, and the inside thereof is filled with a conductive member 28 of copper. The conductive member 28 in the wiring trench 25 constitutes a wiring, and the conductive member 28 in the via hole 26 constitutes an interconnect portion between the upper and lower wirings. The wiring trench 25, via hole 26 and conductive member 28 are formed by a dual damascene method.

On the third-layer interlayer insulating film 23, a plurality of wiring layers are formed having a structure similar to that of the third-layer wiring structure.

An interlayer insulating film 44 of a four-layer structure is formed on the wiring layer 30. The interlayer insulating film 44 has a lamination structure of an etching stopper film 40 of SiN having a thickness of 50 nm, a via layer insulating film 41 of SiO$_2$ having a thickness of 350 nm, an etching stopper film 42 of SiN having a thickness of 50 nm and a wiring layer insulating film 43 of SiO$_2$ having a thickness of 350 nm stacked in this order. These films are deposited by, e.g., chemical vapor deposition (CVD).

Figure 1B:
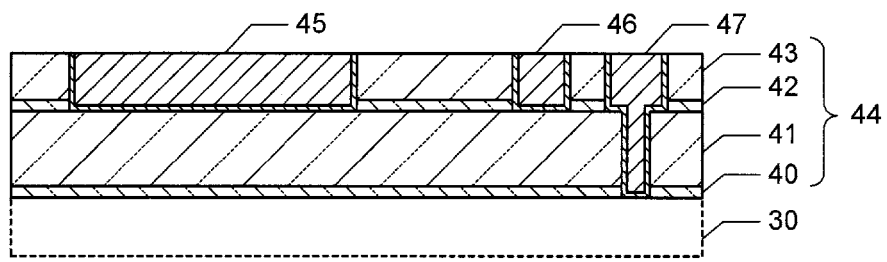
FIG. 1P is a cross sectional view of the semiconductor device according to the first embodiment.

As shown in FIG. 1B, a wiring trench and a via hole are formed in the interlayer insulating film 44 by a damascene method, and a conductive member of copper or copper alloy is embedded in the wiring trench and via hole. FIGS. 1B to 1N show only the lamination structure above the wiring layer 30. A conductive member 45 is embedded in a recess formed in the wiring layer insulating film 43 and etching stopper film 42 in the region where a capacitor is to be formed. In other regions, wirings 46 and 47 are disposed. For example, the wiring 47 is connected to a lower level wiring via a via hole passing through the via layer insulating film 41 and etching stopper film 40. The inner surfaces of the wiring trench and via hole are covered with a barrier metal film of Ta or the like having a thickness of 30 nm.

Figure 1C:
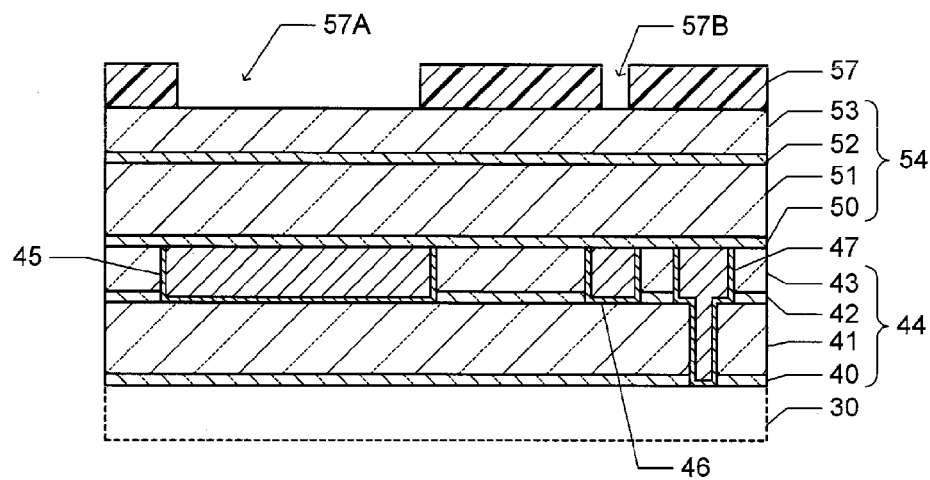

As shown in FIG. 1C, an interlayer insulating film 54 of a four-layer structure is formed on the interlayer insulating film 44. The interlayer insulating film 54 consists of an etching stopper film 50 of SiN having a thickness of 50 nm, a via layer insulating film 51 of SiO$_2$ having a thickness of 750 nm, an etching stopper film 52 of SiN having a thickness of 50 nm and a wiring layer insulating film 53 of SiO$_2$ having a thickness of 350 nm stacked in this order. These films are deposited by, e.g., plasma enhanced CVD. The via layer insulating film 51 may be formed thicker than a targeted thickness, and thereafter the surface thereof is planarized by CMP to form the via layer insulating film 51 having a targeted thickness.

A resist film 57 is formed on the interlayer insulating film 54. This resist film 57 is exposed and developed to form openings 57A and 57B. The opening 57A is disposed at the position corresponding to the conductive member 45 formed in the lower level interlayer insulating film 44, i.e., at the position where a capacitor is to be formed, and the plan shape and size thereof are a rectangle having a shorter side length of about 5 μm. The other opening 57B corresponds to a via hole to be formed in the via layer insulating film 51, and the plan shape and size thereof are a square having a side length of about 0.5 μm.

By using the resist mask 57 as a mask, etching is performed down to the upper surface of the etching stopper film 50 by plasma etching using CF-based gas. The wiring layer insulating film 53, etching stopper film 52 and via layer insulating film 51 are etched under the conditions suitable for these film materials. After etching, the resist mask 57 is removed by plasma ashing using $O_2$ gas.

Figure 1D:
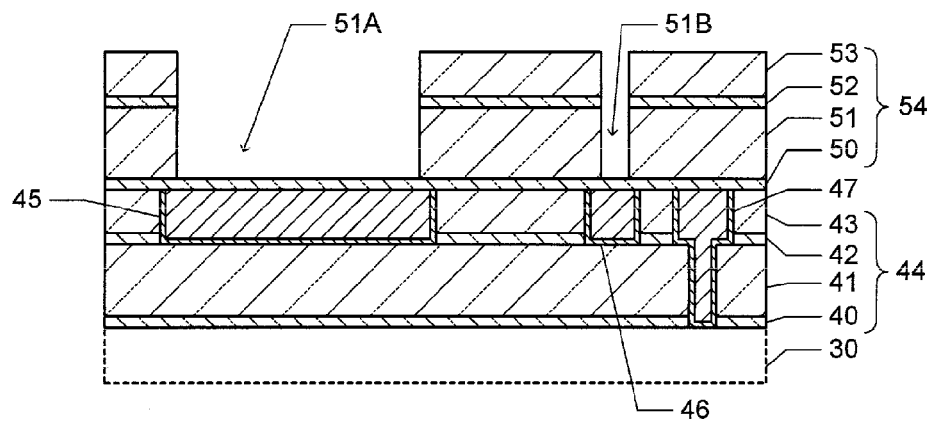

As shown in FIG. 1D, a recess 51A is therefore formed in the region where a capacitor is to be formed, and a via hole 51B is formed in another region.

Figure 1E:
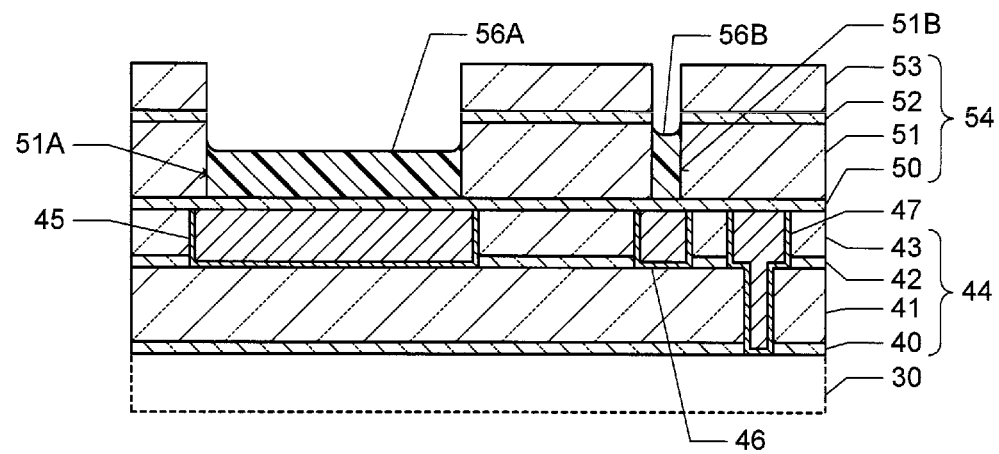

As shown in FIG. 1E, resin is coated on the substrate and partially melted by wet etching, plasma etching or the like to leave protective members 56A and 56B in partial spaces of the recess 51A and via hole 51B.

Figure 1F:
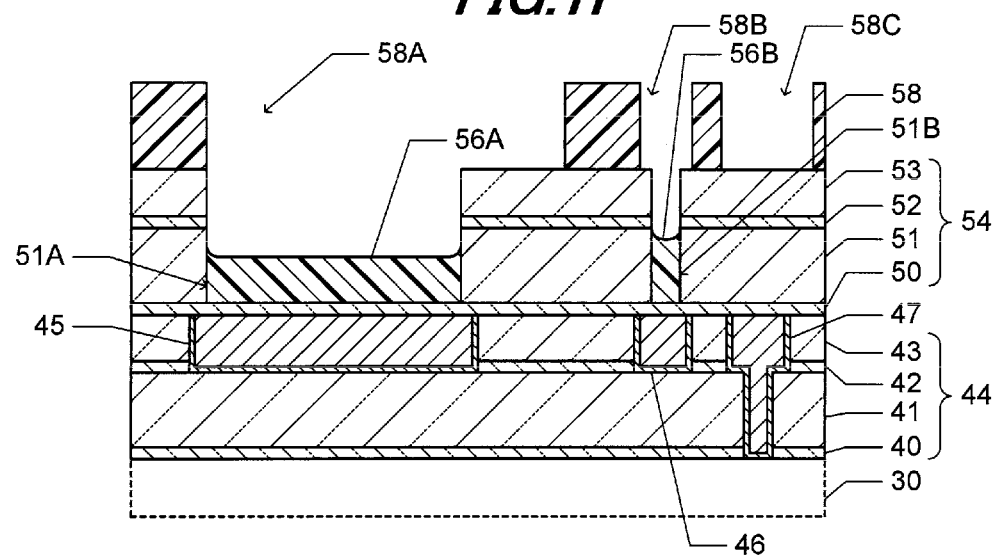

As shown in FIG. 1F, a resist film 58 is formed on the interlayer insulating film 54, and openings 58A, 58B and 58C are formed. The opening 58A has a shape and size including the recess 51A where a capacitor is to be disposed as viewed in plan. The openings 58B and 58C correspond to a wiring to be formed in the wiring layer insulating film 53. The opening 58B partially overlaps with the via hole 51B as viewed in plan.

Figure 1G:
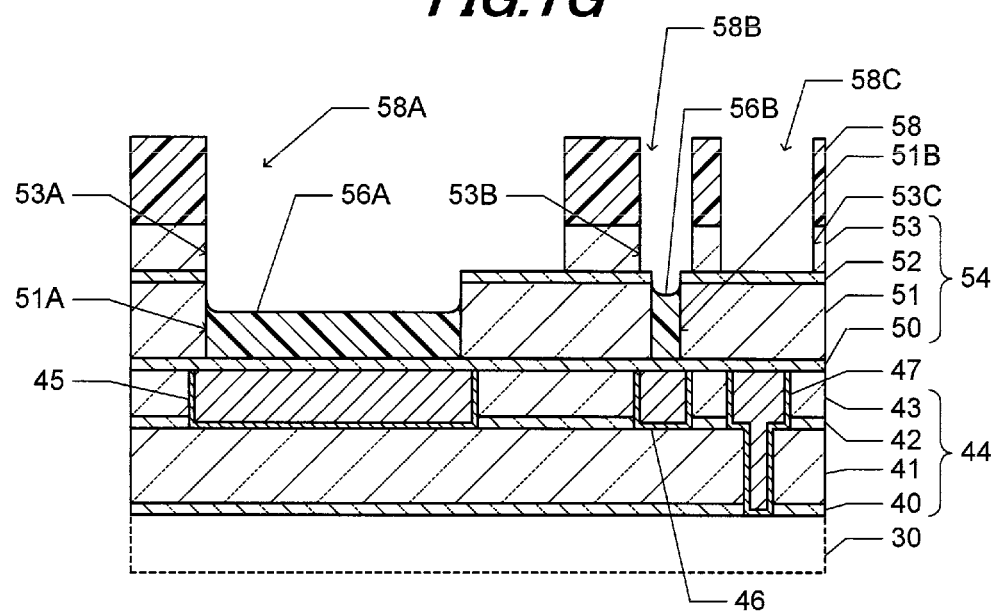

As shown in FIG. 1G, by using the resist film 58 having the openings as a mask, the wiring layer insulating film 53 is etched by plasma etching using CF-based gas until the etching stopper film 52 is exposed. In this case, the protective members 56A and 56B protect the etching stopper film 50 on the bottoms of the recess 51A and via hole 51B. A recess 53A, and wiring trenches 53B and 53C are therefore formed through the wiring layer insulating film 53.

Figure 1H:
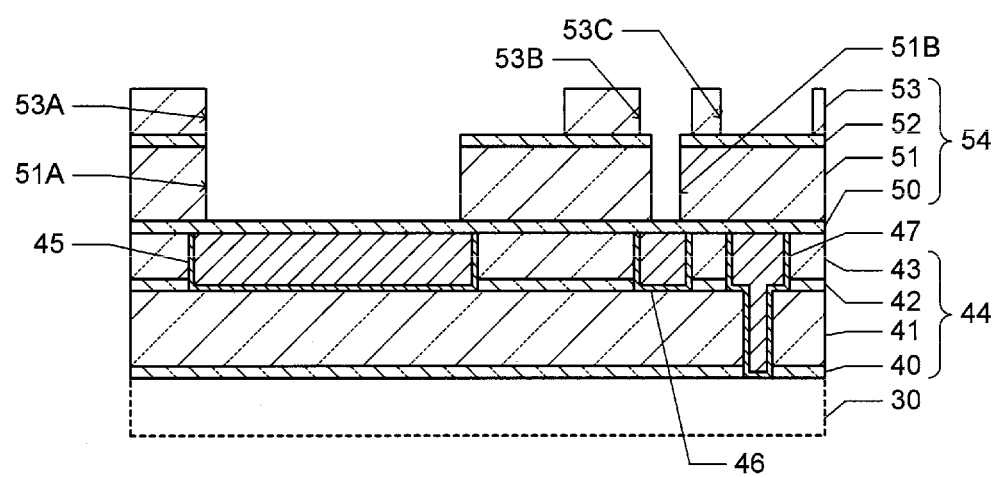

As shown in FIG. 1H, the resist film 58 and protective members 56A and 56B are removed by plasma ashing using $O_2$ gas.

Figure 1I:
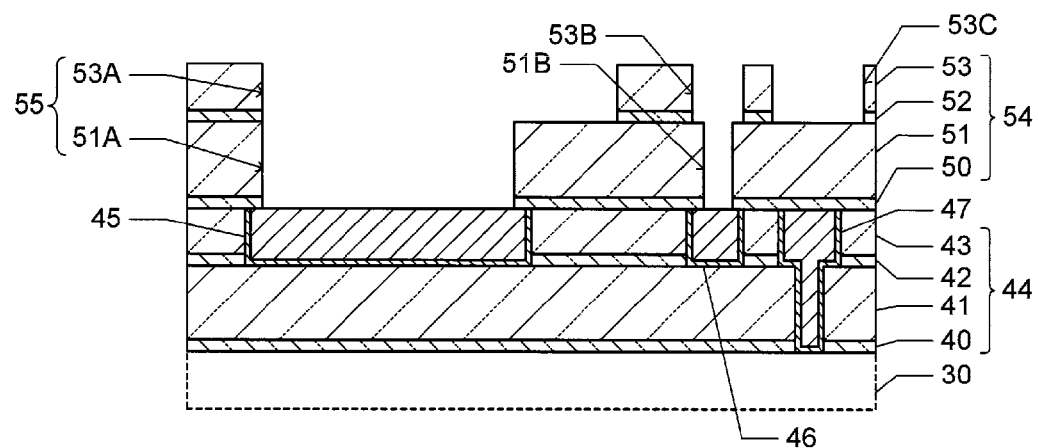

As shown in FIG. 1I, the etching stopper films 52 and 50 left on the bottoms of the recesses 53A and 51A, on the bottoms of the wiring trenches 53B and 53C and on the bottom of the via hole 51B are removed. The etching stopper films 52 and 50 can be removed by plasma etching using CF-based gas, CHF-based gas or mixture gas thereof. A capacitor recess 55 is therefore formed having a two-step structure constituted of the recesses 51A and 53A. The recesses 51A and 53A are called a "via layer portion" and a "wiring layer portion" of the capacitor recess 55.

Figure 1J:
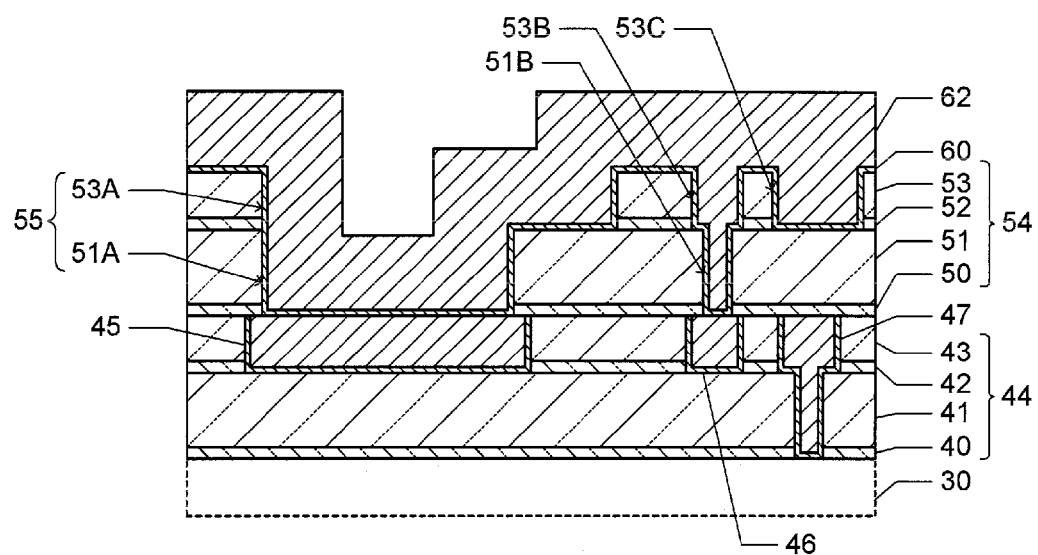

As shown in FIG. 1J, a barrier metal film 60 of Ta having a thickness of 30 nm is formed on the whole substrate surface by sputtering. The barrier metal film 60 may be made of TaN, TiN or the like. A seed film of copper having a thickness of 100 nm is formed on the barrier metal film 60 by sputtering. By using this seed film as an electrode, copper is electroplated to deposit a lower conductive film 62. A thickness of the lower conductive film 62 is set in such a manner that the insides of the wiring trench 53B, via hole 51B and wiring trench 53C are completely filled with the lower conductive film.

Since the capacitor recess 55 has a plan shape wider than that of the wiring trench and via hole, the inside thereof cannot be completely buried. A partial upper surface of the lower conductive film 62 deposited in the via layer portion 51A of the capacitor recess 55 becomes lower than the upper surface of the wiring layer insulating film 53. This is because the capacitor recess 55 is deeper than the wiring trenches 53B and 53C. Although a depth to the bottom of the via hole 51B is equal to a depth of the capacitor recess 55, the size of the plan shape of the via hole 51B is smaller than the thickness of the via layer insulating film 51, so that the via hole 51B is completely filled through isotropic growth. A region outside of the via layer portion 51A of the capacitor recess 55 and inside of the wiring layer portion 53A as viewed in plan is completely filled with the lower conductive film 62.

Figure 1K:
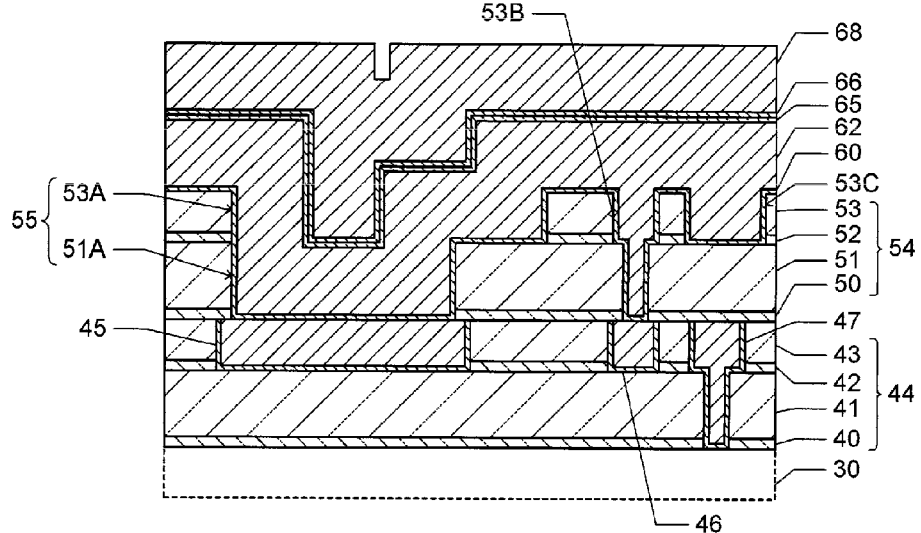

As shown in FIG. 1K, a dielectric film 65 of SiN having a thickness of 50 nm is formed on the lower conductive film 62 by plasma enhanced CVD. The dielectric film 65 may be made of insulating material different from SiN, such as SiC, SiCN or the like. The dielectric film may have a two-layer structure of an oxide insulating layer of Ta, Hf, Al or the like and an insulating layer of SiN, SiC, SiCN or the like.

A barrier metal film 66 of Ta having a thickness of 30 nm is formed on the dielectric film 65 by sputtering. A copper seed film is formed on the barrier metal film 66 and copper is electroplated to form an upper conductive film 68 having a thickness of 900 nm. The space in the capacitor recess 55 still not filled is completely filled with the upper conductive film 68. The lower conductive film 62 and upper conductive film 68 may be made of metal different from copper, such as aluminum (Al), silver (Ag) or the like.

Figure 1L:
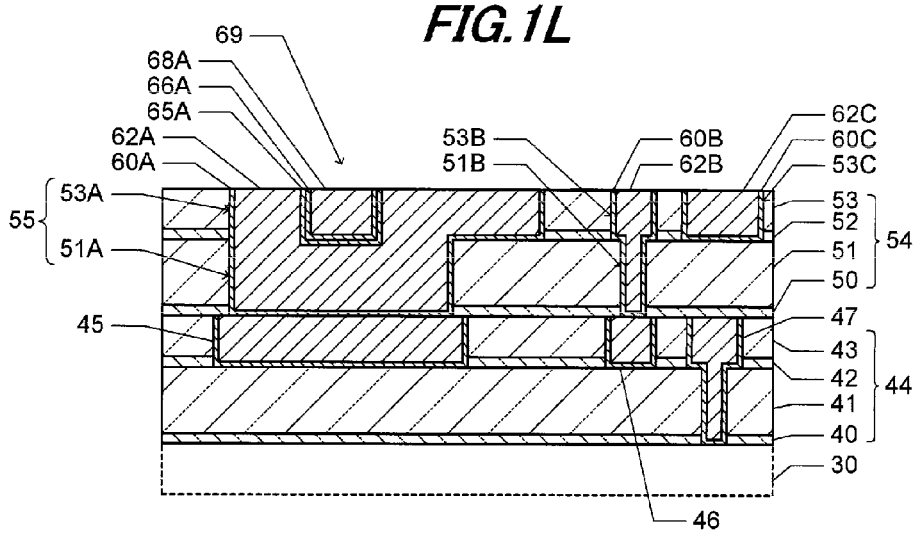

As shown in FIG. 1L, CMP is performed until the upper surface of the wiring layer insulating film 53 is exposed. This CMP method will be described in the following. First, CMP is performed until the barrier metal 66 shown in FIG. 1K is exposed, under the condition that the upper electrode film 68 can be easily and selectively polished relative to the barrier metal film 66. Next, by changing the polishing conditions, the barrier metal film 66 and dielectric film 65 are polished. Next, CMP is performed until the barrier metal 60 is exposed, under the condition that the lower conductive film 62 can be easily and selectively polished relative to the barrier metal film 60. Lastly, the barrier metal film 60 is polished to expose the wiring layer insulating film 53. Under the condition that the five layers from the barrier metal film 60 to upper conductive film 68 can be polished generally at an equal rate, CMP may be performed until the wiring layer insulating film 53 is exposed, without changing the polishing conditions.

A capacitor 69 is therefore formed being constituted of a lower electrode 62A consisting of a portion of the lower conductive film 62 left in the capacitor recess 55, a capacitor dielectric film 65A consisting of a portion of the dielectric film 65 and an upper electrode 68A consisting of a portion of the upper conductive film 68. A wiring 62B consists of a portion of the lower conductive film 62 left in the wiring trench 53B and via hole 51B, and a wiring 62C consists of a portion of the lower conductive film 62 left in the wiring trench 53C.

As viewed in plan, the upper electrode 68A of the capacitor 69 is located within the via layer portion 51A of the capacitor recess 55. The barrier metal film 60A and lower electrode 62A embedded in the wiring layer portion 53A in a region outside the via layer portion 51A has the same lamination structure as the barrier metal film 60C and wiring 62C in the other wiring trench 53C formed in the wiring layer insulating film 53.

Figure 1M:
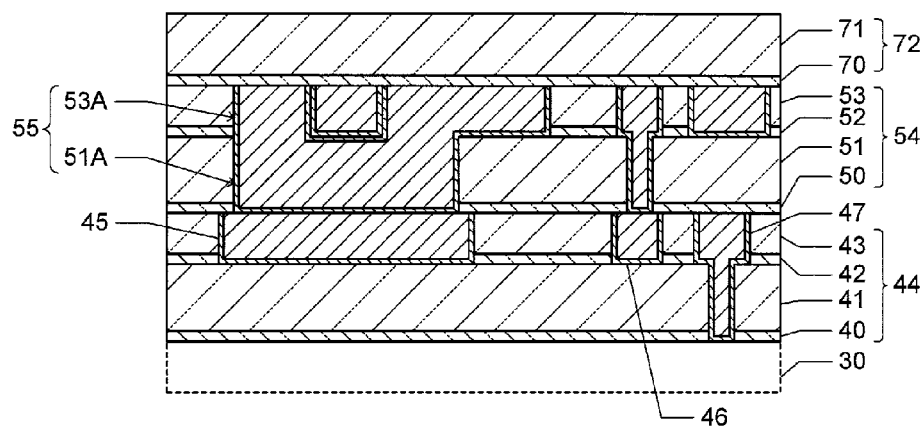

As shown in FIG. 1M, an interlayer insulating film 72 is formed on the interlayer insulating film 54. The interlayer insulating film 72 has a two-layer structure of an etching stopper film 70 of SiN having a thickness of 70 nm and a via layer insulating film 71 of $SiO_2$ having a thickness of 900 nm stacked in this order. The surface of the via layer insulating film 71 is planarized by CMP.

Figure 1N:
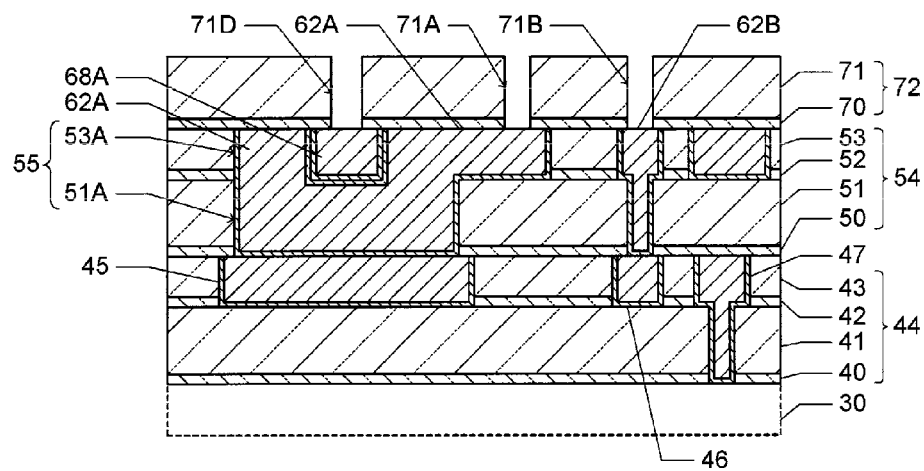

As shown in FIG. 1N, via holes 71D, 71A and 71B are formed through the interlayer insulating film 72. The upper electrode 68A of the capacitor 69 is therefore exposed on the bottom of the via hole 71D, and the lower electrode 62A is exposed on the bottom of the via hole 71A. The wiring 62B is exposed on the bottom of the via hole 71B. As viewed in plan, the via hole 71A is disposed at a position outside the via layer portion 51A of the capacitor recess 55 and partially superposing upon the wiring layer portion 53A.

Figure 1O:
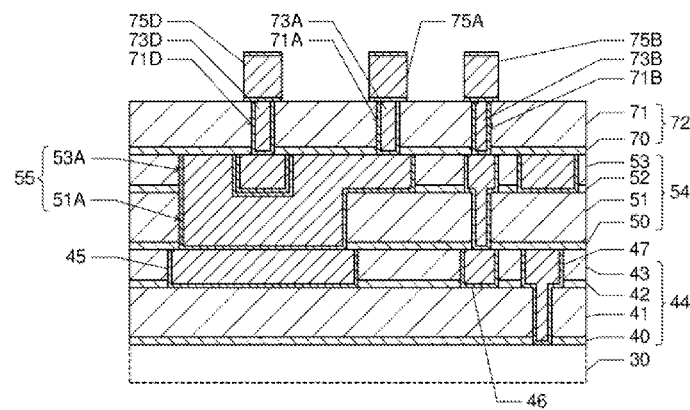

As shown in FIG. 1O, a barrier metal film is formed covering the inner surfaces of the via holes 71D, 71A and 71B, and plugs 73D, 73A and 73B of tungsten (W) are embedded in the via holes 71D, 71A and 71B. The barrier metal film is made of TiN, WN, WSiN or the like. Wirings 75D, 75A and 75B are formed on the interlayer insulating film 72. Each of these wirings consists of a lower barrier metal film having a lamination structure of a Ti film and a TiN film and a thickness of 50 nm, a main portion made of aluminum (Al) or copper-added aluminum (AlCu) having a thickness of 900 nm and an upper barrier metal film having a lamination structure of a Ti film and a TiN film and a thickness of 50 nm. The wirings 75D, 75A and 75B are connected to the plugs 73D, 73A and 73B, respectively. Pads (not shown) are formed in other regions of the same layer as that of these wirings.

Figure 1P:
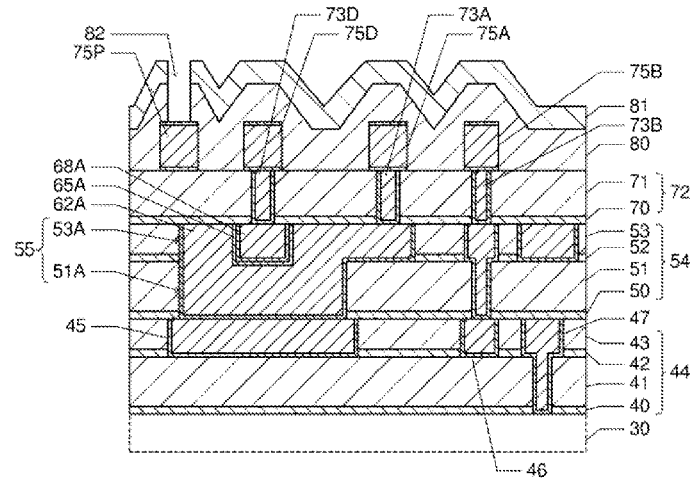

As shown in FIG. 1P, an interlayer insulating film 80 of $SiO_2$ having a thickness of 900 nm is formed on the whole substrate surface, and a cover film 81 of SiN having a thickness of 500 nm is formed on the interlayer insulating film 80. Openings (not shown) are formed through the interlayer insulating film 80 and cover film 81 to expose the pads.

FIG. 2 is a plan view of the capacitor in the semiconductor device according to the first embodiment. A cross sectional view taken along one-dot chain line A1-A1 shown in FIG. 2 corresponds to the cross sectional views shown in FIGS. 1A to 1P. The conductive member 45 is disposed in the interlayer insulating film below the capacitor 69. The via layer portion 51A of the capacitor recess 55 is located within the conductor member 45, and the upper electrode 68A is located within the via layer portion 51A. Since the plan shape of the upper electrode 68A is not defined by photolithography, an exposure mask is not used for the upper electrode 68A. The wiring layer portion 53A includes the via layer portion 51A therein.

A plurality of via holes 71D for connection to the wiring 75D are disposed within the upper electrode 68A. A plurality of via holes 71A for connection to the wiring 75A are disposed inside the wiring layer portion 53A of the capacitor recess 55 and outside the via layer portion 51A.

In the first embodiment, the via layer portion 51A of the capacitor recess 55 is formed at the same time when the via hole 51B is formed in the process shown in FIG. 1D. The wiring layer portion 53A is formed at the same time when the wiring trenches 53B and 53C are formed in the process shown in FIG. 1G. Therefore, it is not necessary to prepare a mask pattern for exclusive use for forming the capacitor. Furthermore, the size of the region between an outer periphery of the via layer portion 51A of the capacitor recess 55 shown in FIG. 2 and an outer periphery of the wiring portion 53A can be set as desired by mask pattern designs. In this region, the upper flat surface of the lower electrode 62A of the capacitor 69 is disposed. It is therefore possible to easily align the position of the via holes 71A for connection between the lower electrode 62A and upper wiring 75A.

Figure 3:
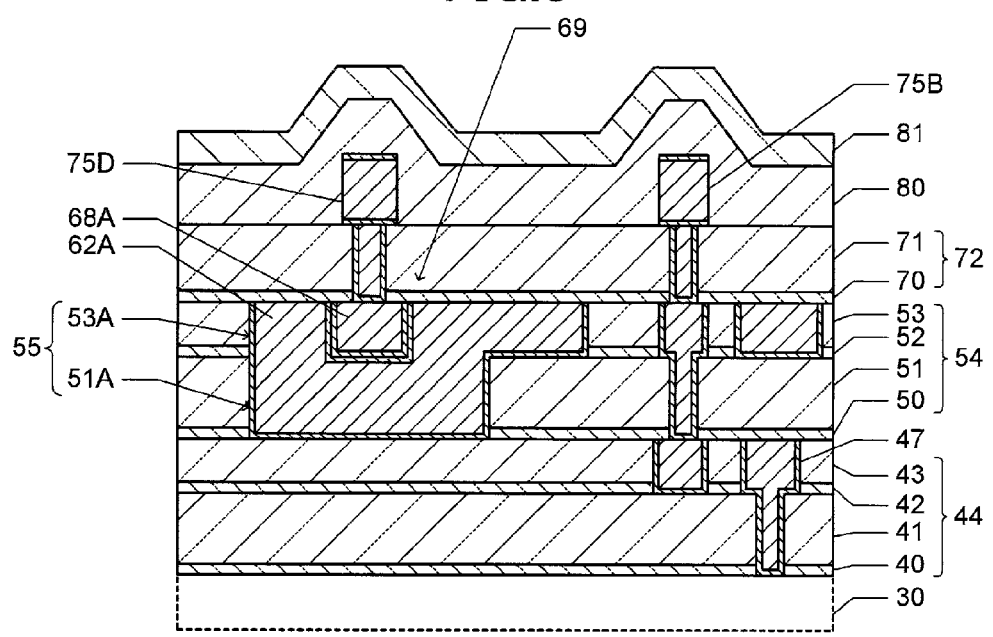
FIG. 3 is a cross sectional view of the semiconductor device according to a second embodiment.

FIG. 3 is a cross sectional view of a semiconductor device of the second embodiment. Description will be made by paying attention to different points from the semiconductor device of the first embodiment shown in FIG. 1P. In the second embodiment, the conductive member 45 is not disposed below the capacitor 55 shown in FIG. 1P. Further, the plug 73A and wiring 75A connected to the upper surface of the lower electrode 62A of a capacitor 69 are not disposed. If the lower electrode 62A of the capacitor 69 has sufficiently low resistance, the supplementary conductive member 45 is not required to be disposed.

Figure 4:
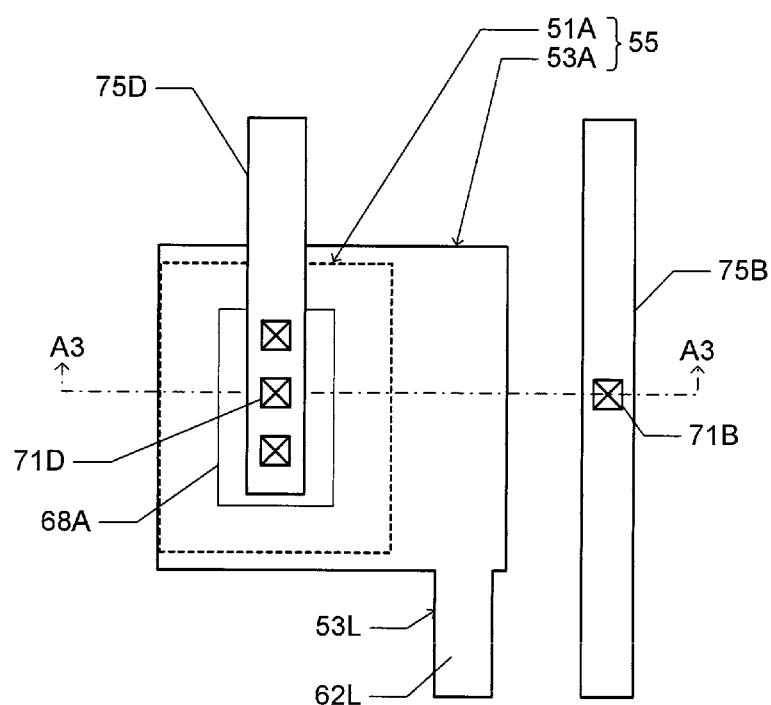
FIG. 4 is a plan view of the semiconductor device according to the second embodiment.

FIG. 4 is a plan view of the semiconductor device of the second embodiment. A cross sectional view taken along one-dot chain line A3-A3 in FIG. 4 corresponds to FIG. 3. As shown in this cross sectional view, a wiring 62L is disposed in place of the wiring 75A of the semiconductor device of the first embodiment shown in FIG. 2. The wiring 62L is embedded in a wiring trench 53L formed in the wiring layer insulating film 53 in which the wiring portion 53A of the capacitor recess 55 is formed. The electrode lead wiring 62L can be disposed in this manner in the same layer as that of the lower electrode 62A.

Figure 5:
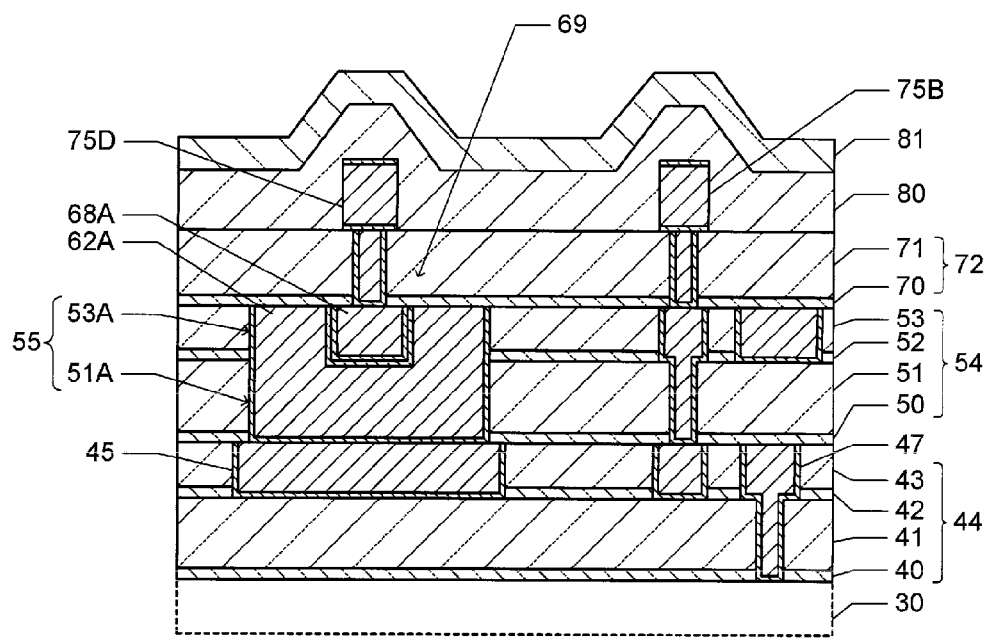
FIG. 5 is a cross sectional view of the semiconductor device according to a third embodiment.

FIG. 5 is a cross sectional view of a semiconductor device of the third embodiment. Description will be made by paying attention to different points from the semiconductor device of the first embodiment shown in FIG. 1P. In the third embodiment, the side surfaces of the wiring portion 53A and via layer portion 51A of the capacitor recess 55 are flush with each other in the cross sectional view shown in FIG. 5. The plug 73A and upper level wiring 75A connected to the lower electrode 62A on the upper surface thereof are not disposed.

Figure 6:
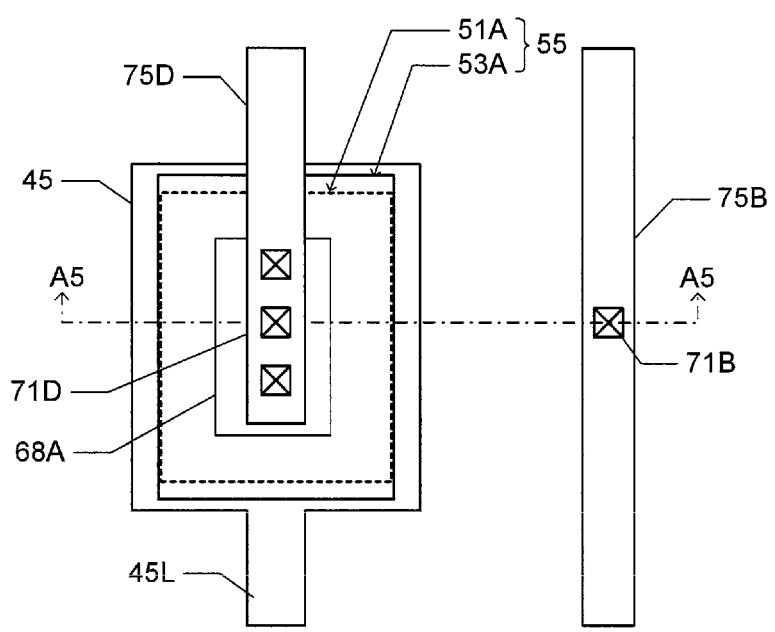
FIG. 6 is a plan view of the semiconductor device according to the third embodiment.

FIG. 6 is a plan view of the semiconductor device of the third embodiment. A cross sectional view taken along one-dot chain line A5-A5 in FIG. 6 corresponds to FIG. 5. As shown in this cross sectional view, the outer peripheries of the via layer portion 51A and wiring portion 53A of the capacitor recess 55 coincide with each other. A wiring 45L is disposed in place of the wiring 75A connected to the lower electrode 62A. The wiring 45L is embedded in a wiring trench formed in the interlayer insulating film 44 in which the conductive member 45 is disposed, and is continuous with the conductive member 45. As described above, the electrode lead wiring 45L can be disposed in the interlayer insulating film 44 under the capacitor 69.

Figure 7:
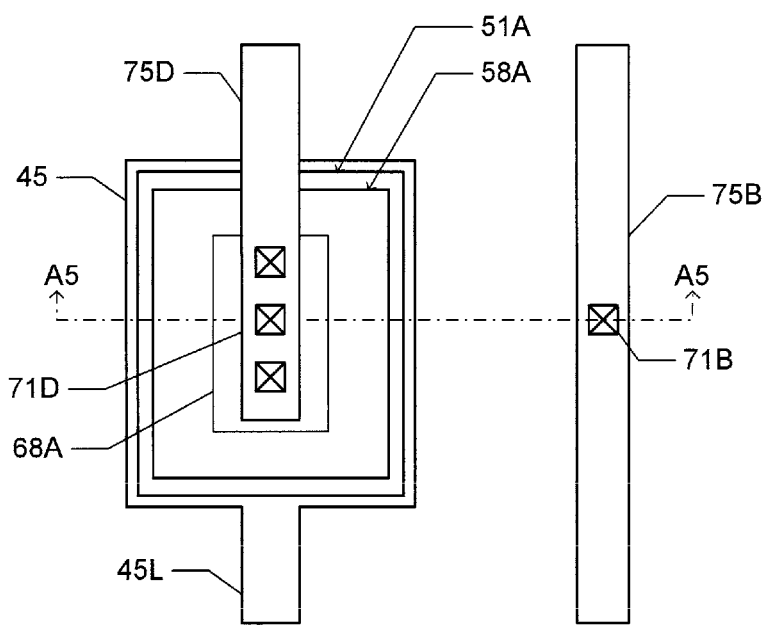
FIG. 7 is a plan view of a semiconductor device according a modification of the third embodiment.

As shown in FIG. 7, a mask pattern, in which an opening 58A of the resist film 58 for forming the wiring layer portion 53A of the capacitor recess 55 is located within the via layer portion 51A, may be used. In this case, in the process shown in FIG. 1F, since the opening 58A of the resist film 58 is smaller than the via layer portion 51A, the protective member 56A is exposed on the whole bottom of the opening 58A. In the process shown in FIG. 1G, the wiring layer insulating film 53 where the capacitor is to be disposed is not etched. Therefore, the capacitor recess 55 has a side surface without a step.

Figure 8:
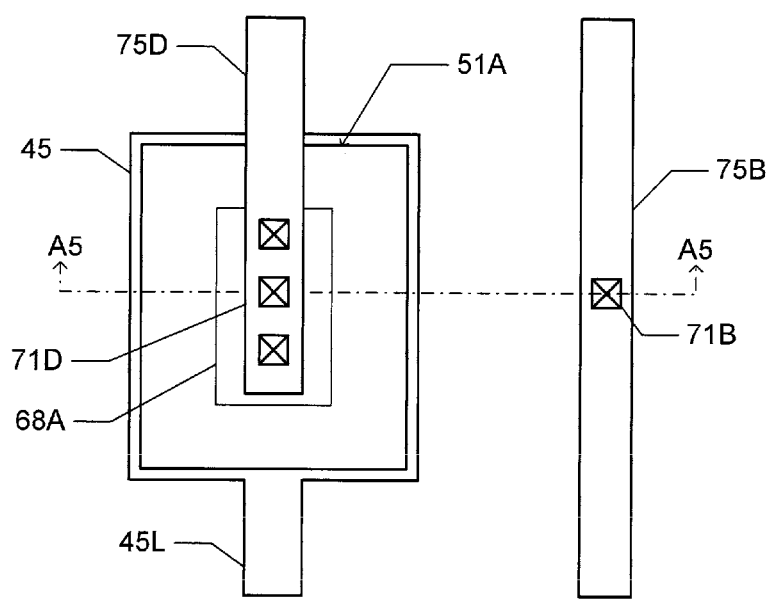
FIG. 8 is a plan view of the semiconductor device according to the modification of the third embodiment.

As shown in FIG. 8, the opening 58A for forming the wiring layer portion 53A shown in FIG. 7 may not be formed. Also in this case, the capacitor recess 55 is formed having the same structure as that shown in FIG. 7.

Figure 9:
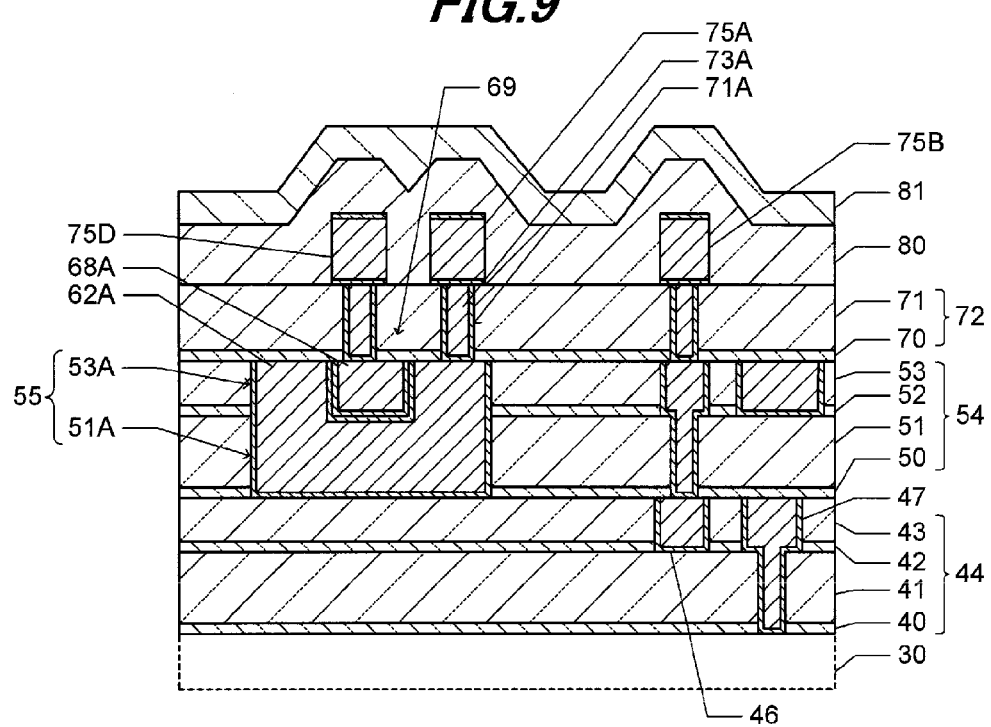
FIG. 9 is a cross sectional view of the semiconductor device according to a fourth embodiment.

FIG. 9 is a cross sectional view of a semiconductor device of the fourth embodiment. Description will be made by paying attention to different points from the semiconductor device of the third embodiment shown in FIGS. 5 and 6. Also in the fourth embodiment, as in the case of the third embodiment, a step is not formed on the side surface of the capacitor recess 55 as shown in the cross sectional view shown in FIG. 9. In the fourth embodiment, the conductive member 45 disposed below the capacitor 69 shown in FIG. 5 is not formed. Instead, the lower electrode 62A of the capacitor 69 is connected to an upper level wiring 75A via a plug 73B in a via hole 71A formed in the upper interlayer insulating film 72.

Figure 10:
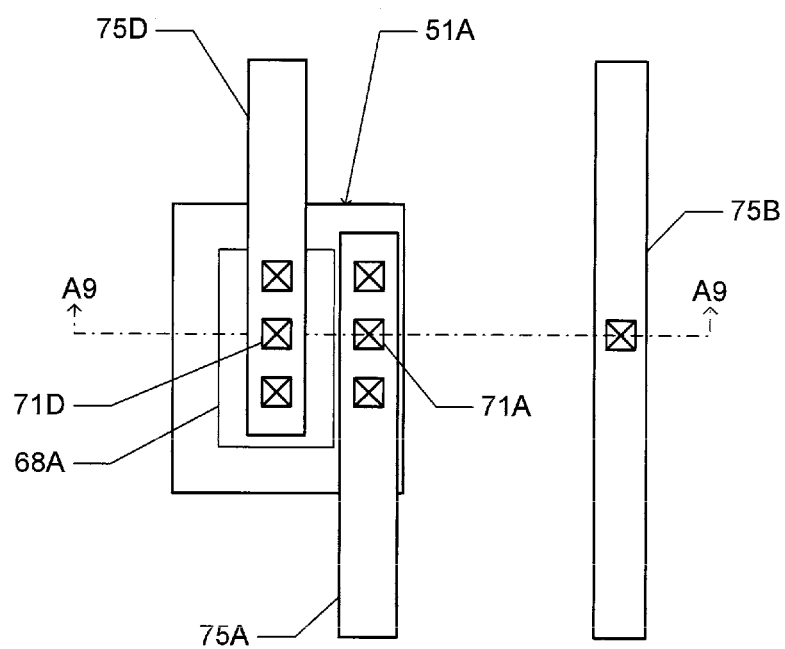
FIG. 10 is a plan view of the semiconductor device according to the fourth embodiment.

FIG. 10 is a plan view of the semiconductor device of the fourth embodiment. A cross sectional view taken along one-dot chain line A9-A9 in FIG. 10 corresponds to FIG. 9. The via hole 71A does not overlap with the upper electrode 68A, but is disposed so as to overlap with the via layer portion 51A of the capacitor recess 55. If a width from the outer periphery of the via layer portion 51A to the border of the upper electrode 68A is about 700 nm, position alignment of the via hole 71A can be performed at a sufficient precision. In order to satisfy this condition, it is sufficient if the thickness of the lower conductive film 62 shown in FIG. 1J is about 700 nm. In this embodiment, since the thickness of the interlayer insulating film 54 (a depth of the capacitor recess 55) is 1200 nm, even if the thickness of the lower conductive film 62 is set to about 700 nm, a partial upper surface of the lower conductive film 62 is lower than the upper surface of the interlayer insulating film 54.

Next, with reference to FIGS. 11A to 12B, the fifth embodiment will be described. In FIG. 1K of the first embodiment, the surface of the lower conductive film 62 formed by electroplating copper directly reflects the underlying stepwise shape, and the sidewalls of the concave portions formed on the surface of the lower conductive film 62 cross the flat surface generally at a right angle. Depending upon electroplating conditions, a cross portion between the side surface and flat surface is rounded. Reflecting this round portion, the surfaces of the dielectric film 65 and barrier metal film 66 are also rounded. Depending upon etching conditions for forming a recess in the interlayer insulating film 54, the inner surface itself of the capacitor recess 55 has a rounded portion where the side surface and flat surface are crossing with each other. In this case, reflecting this underlying rounded surface, the surface of the lower conductive film 62 is rounded.

Figure 11A:
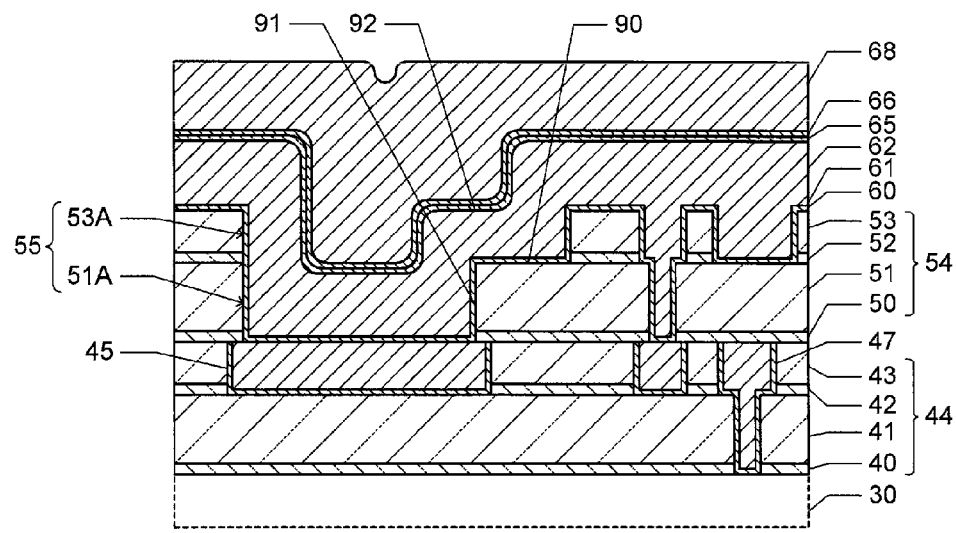
FIGS. 11A and 11B are cross sectional views of a semiconductor device during manufacture according to a comparative example.

FIG. 11A is a cross sectional view showing a structure in which the surface is rounded, where the flat surface and the side surface of the recess formed on the surface of the lower conductive film 62 are crossing with each other. An upper surface 92 of the lower conductive film 62 is generally flush with the upper surface of the wiring layer insulating film 53, above the portion where a bottom 90 of the wiring portion 53A of the capacitor recess 55 and a side surface 91 of the via layer portion 51A are crossing with each other.

Figure 11B:
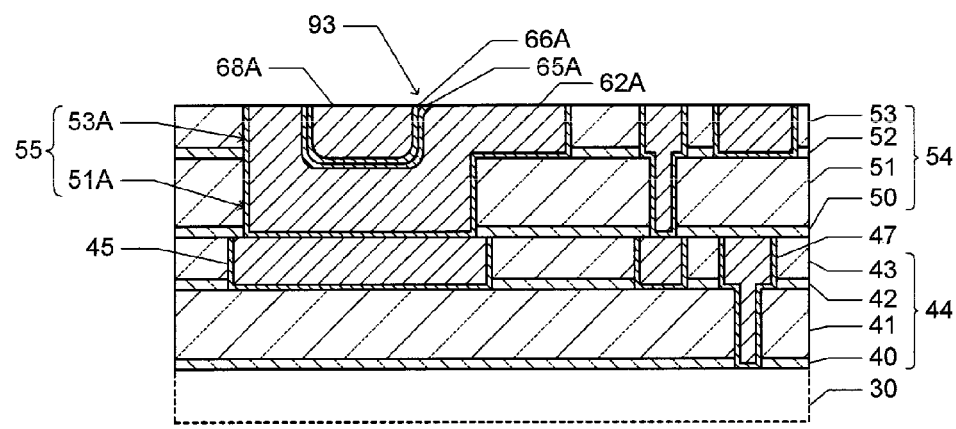

As shown in FIG. 11B, as CMP is performed down to the upper surface of the wiring layer insulating film 53, rounded portions of the dielectric film 65 and barrier metal film 66 are left in the capacitor recess 55. Therefore, in the cross sectional view shown in FIG. 11B, a corner having an acute angle occurs at a cross portion 93 between an outer surface of the barrier metal film 66A and the upper flat surface of the capacitor 69. An electric field concentrates upon this corner, so that the breakdown voltage characteristics are degraded.

Figure 12A:
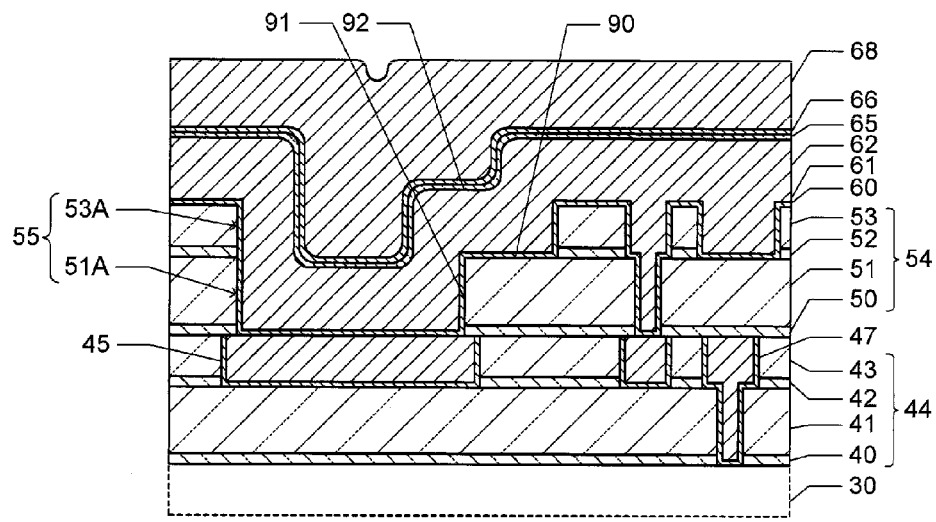
FIGS. 12A and 12B are cross sectional views of a semiconductor device during manufacture according to a fifth embodiment.

FIG. 12A is a cross sectional view of a semiconductor device during manufacture according to the fifth embodiment. The lower conductive film 62 is formed in such a manner that an upper surface 92 of the lower conductive film 62 is higher than an upper surface of the wiring insulating film 53 by a predetermined value, above a portion where the side surface 91 of the via layer portion 51A and the bottom surface 90 of the wiring layer portion 53A of the capacitor recess 55 are crossing with each other. A rounded portion where the upper surface 92 and the side surface of a concave portion on the surface of the lower conductive film 62 formed in the via layer portion 51A of the capacitor recess 55, positions above the upper surface of the wiring layer insulating film 53. Therefore, the rounded portion can be removed by CMP.

Figure 12B:
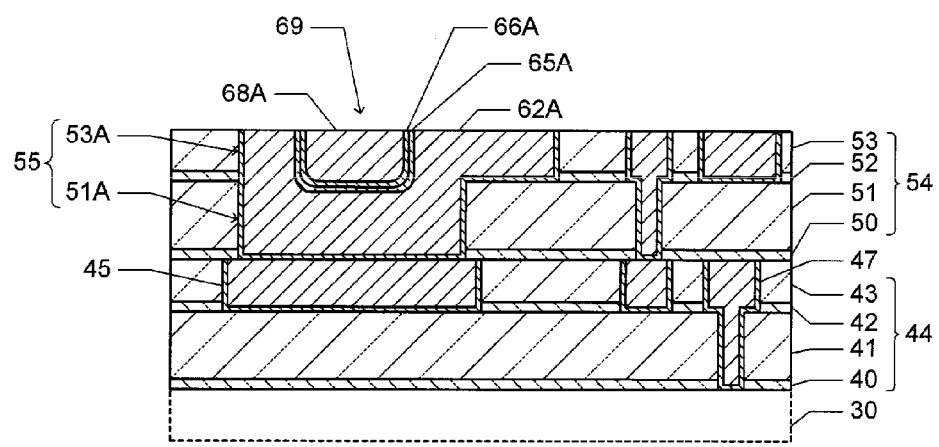

FIG. 12B shows the structure after CMP. The outer surface of the barrier metal film 66A left in the capacitor recess 55 and the upper flat surface of the capacitor 69 are crossing with each other generally at a right angle. Since the corner having an acute angle shown in FIG. 11B is not formed, it is possible to suppress electric field concentration and avoid degradation of the breakdown voltage characteristics.

In order to prevent the corner having an acute angle from being formed, it is preferable that the lower conductive film 62 is formed in such a manner that the upper surface 92 of the lower conductive film 62 is higher than the upper surface of the wiring layer insulating film 53 by 350 nm or more, in the structure shown in FIG. 12A.

Although the description concerns about avoiding disadvantages to be caused by a rounded portion where the flat surface and the side surface are crossing with each other, a rounded portion not only causes disadvantages but also provide the following advantages.

Generally, if a film is formed on a surface having a flat surface and a side surface crossing with other generally at a right angle and not having a rounded portion, coverage may be lowered in some cases. An occurrence frequency of coverage defects can be lowered by forming a rounded portion where the flat surface and the side surface are crossing with other. For example, if an intersection between the bottom surface and the side surface of the capacitor recess 55 is angulated and the barrier metal film 60 is formed by sputtering, coverage at the right angle corner is generally degraded. By rounding the intersection, coverage of a film to be formed on this intersection can be suppressed from being lowered.

Next, with reference to FIGS. 13A and 13B, a manufacture method for a semiconductor device according to the sixth embodiment will be described.

Figure 13A:
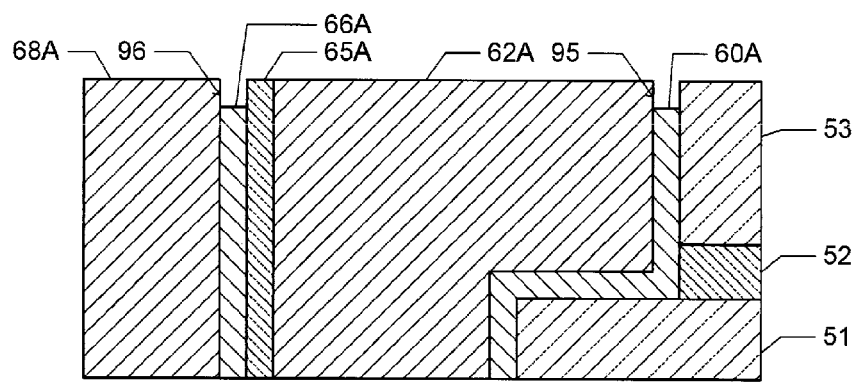
FIGS. 13A and 13B are cross sectional views of a semiconductor device during manufacture according to a sixth embodiment.

FIG. 13A is a partially enlarged diagram showing the state after CMP of the first embodiment shown in FIG. 1L. At the last stage of CMP, CMP is performed under the condition that a polishing rate of the barrier metal film 60A and 66A is faster than a polishing rate of the wiring layer insulating film 53, capacitor dielectric film 65A, lower electrode 62A and upper electrode 68A. In this case, the upper end of the border of the barrier metal film 66A is lower than the upper end of the border of the capacitor dielectric film 65A and the upper surface of the upper electrode 68A. Concave portions 95 and 96 are therefore formed at positions corresponding to the borders of the barrier metal films 60A and 66A.

Figure 13B:
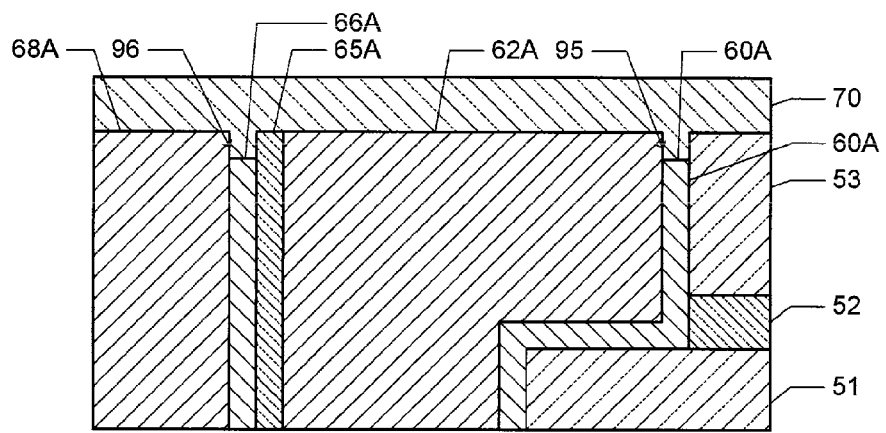

As shown in FIG. 13B, the concave portions 95 and 96 are filled with the etching stopper film 70. In the structure shown in FIG. 1L, the upper end of the border of the barrier metal film 66A is spaced from the border of the upper surface of the lower electrode 62A only by a thickness of the capacitor dielectric film 65A. In the sixth embodiment shown in FIG. 13B, a distance between the upper end of the border of the barrier metal film 66A and the border of the upper surface of the lower electrode 62A corresponds to sum of a thickness of the capacitor dielectric film 65A and a depth of the concave portion 96.

An interface between the capacitor dielectric film 65A and etching stopper film 70 is likely to cause an increase in leak current and breakdown voltage degradation. In the sixth embodiment, a path on the interface from one electrode to the other electrode of the capacitor 69 is elongated, so that it is possible to prevent an increase in leak current and breakdown voltage degradation.

Next, with reference to FIGS. 14A and 14B, a manufacture method for a semiconductor device according to the seventh embodiment will be described. Description will be made by paying attention to different points from the sixth embodiments shown in FIGS. 13A and 13B. In the seventh embodiment, a polishing rate of the lower electrode 62A and upper electrode 68A is faster than a polishing rate of the wiring layer insulating film 53, barrier metal film 60A and 66A and capacitor dielectric film 65A.

Figure 14A:
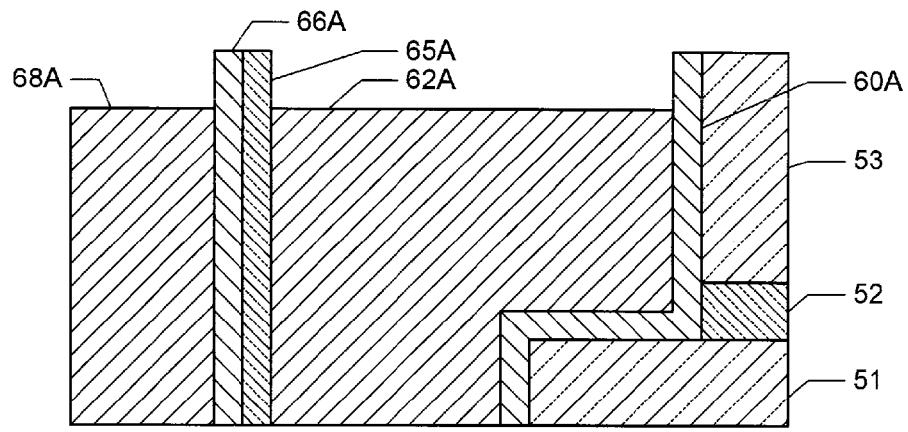
FIGS. 14A and 14B are cross sectional views of a semiconductor device during manufacture according to a seventh embodiment.

FIG. 14A shows the structure after CMP. The upper ends of the capacitor dielectric film 65A and barrier metal film 66A protrude from the upper surface of the lower electrode 62A and the upper surface of the upper electrode 68A.

Figure 14B:
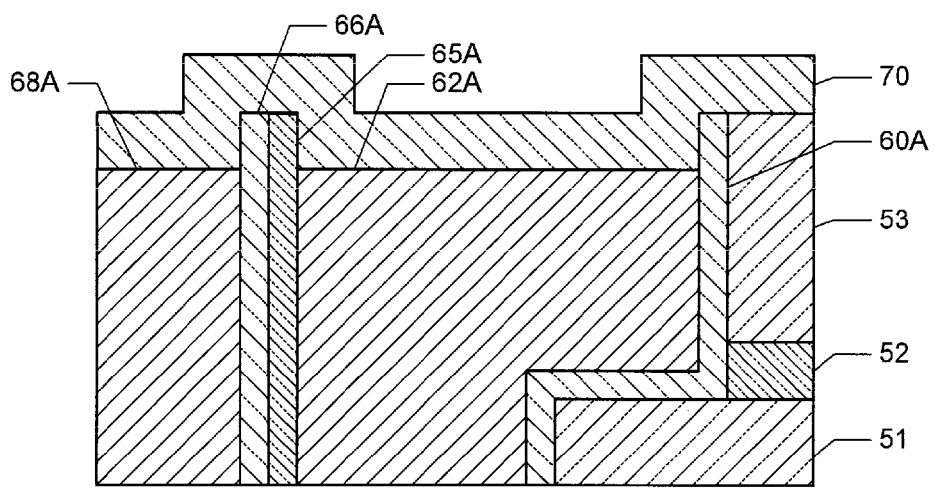

FIG. 14B shows the structure after the barrier metal film 70 is formed. In the seventh embodiment, a distance between the upper end of the border of the barrier metal film 66A and the border of the upper surface of the lower electrode 62A corresponds to sum of a thickness of the capacitor dielectric film 65A and a height from the upper surface of the lower electrode 62A to the upper end of the capacitor dielectric film 65A. As in the case of the sixth embodiment, it is therefore possible to prevent an increase in leak current and breakdown voltage degradation.

Figure 15:
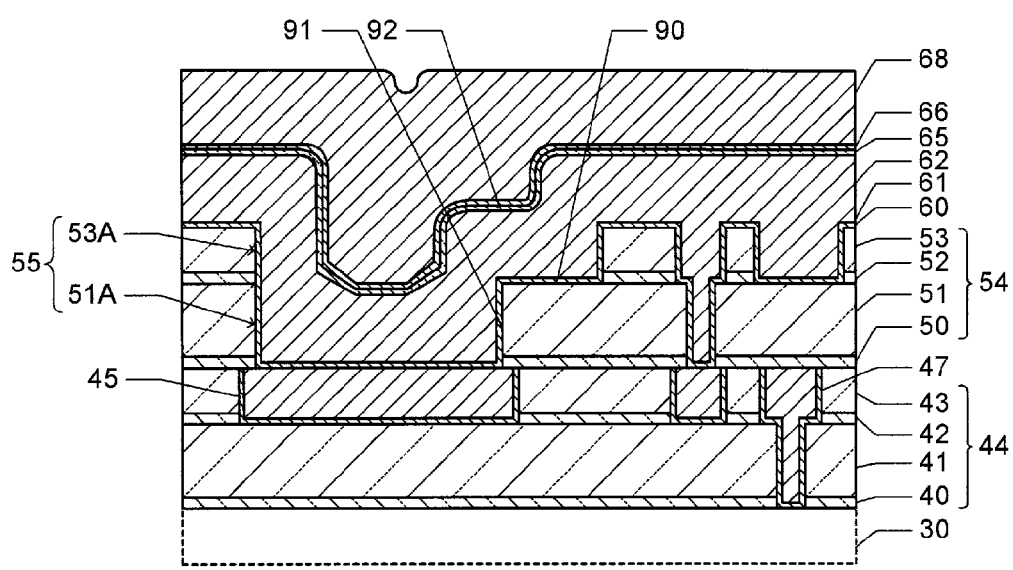
FIG. 15 is a cross sectional view of a semiconductor device during manufacture according to an eighth embodiment.
Figure 16:
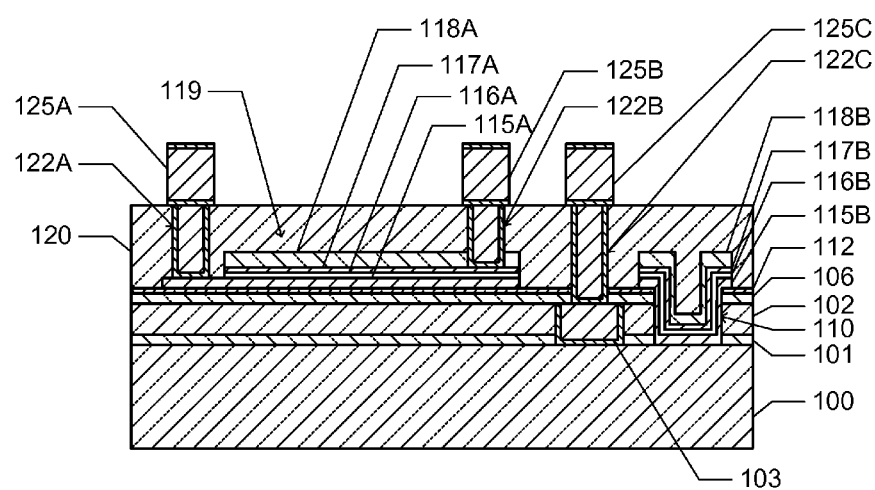
FIG. 16 is a cross sectional view of a semiconductor device with a conventional capacitor.
Figure 17A:
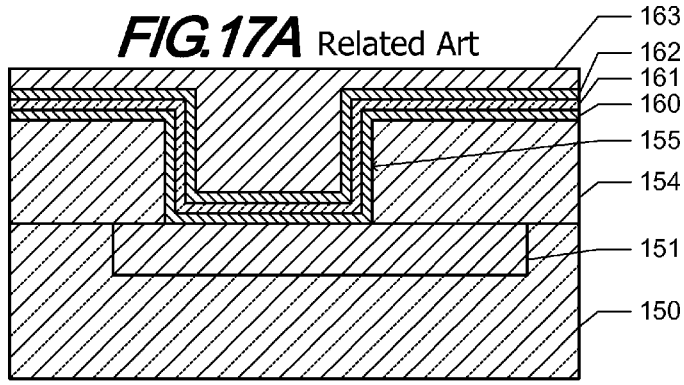
FIGS. 17A to 17E are cross sectional views of a semiconductor device with a conventional capacitor during manufacture.
Figure 17B:
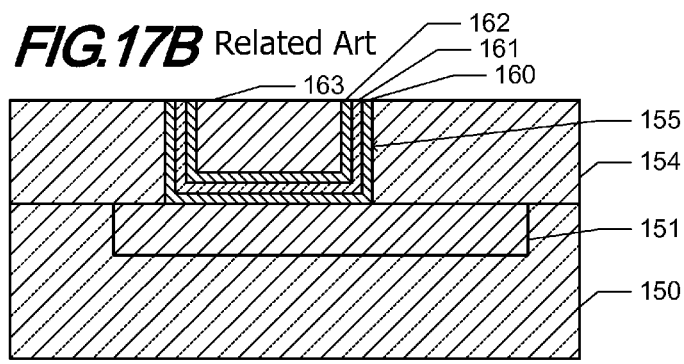
Figure 17C:
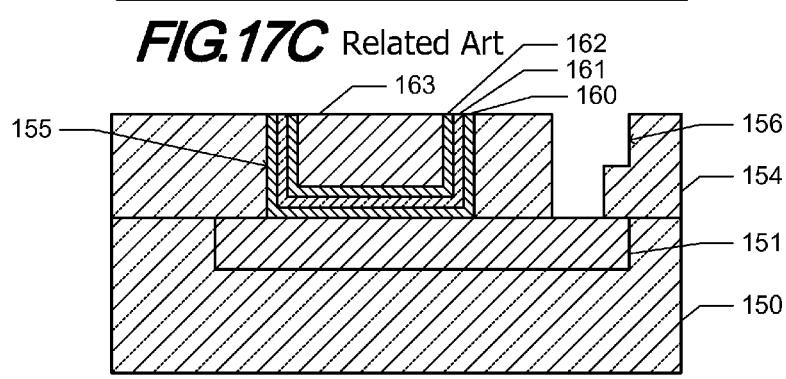
Figure 17D:
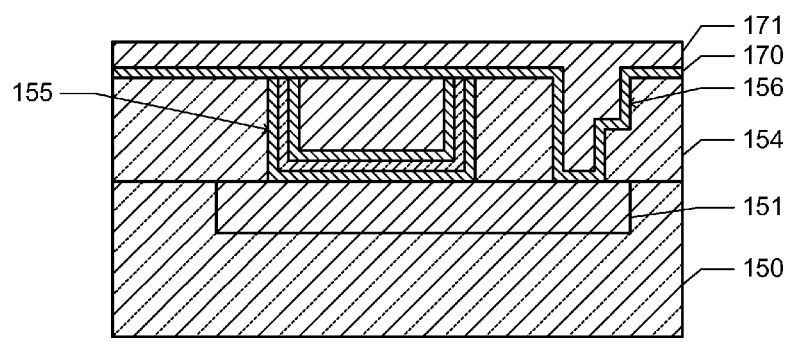
Figure 17E:
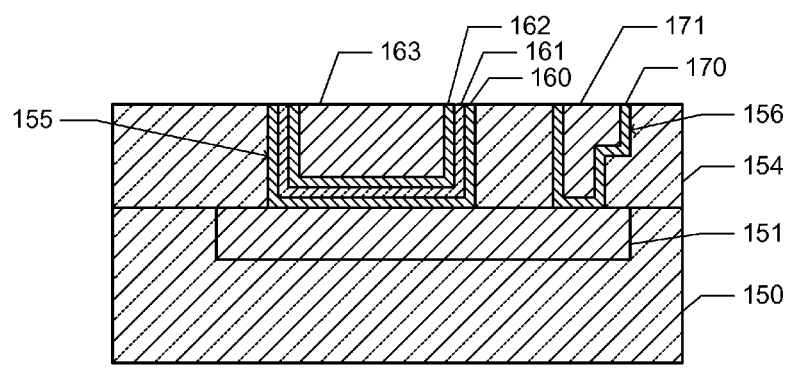
Figure 18A:
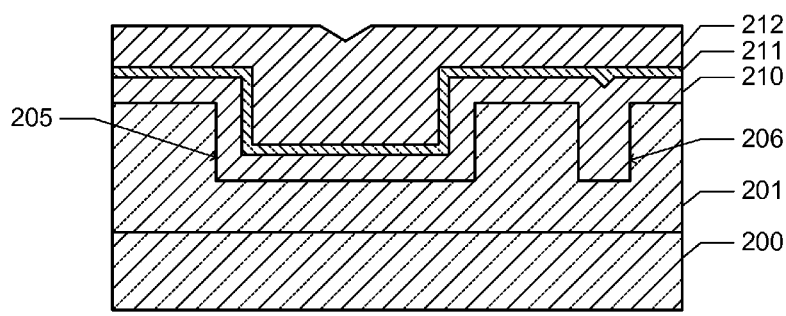
FIGS. 18A and 18B are cross sectional views of a semiconductor device with a conventional capacitor during manufacture.
Figure 18B:
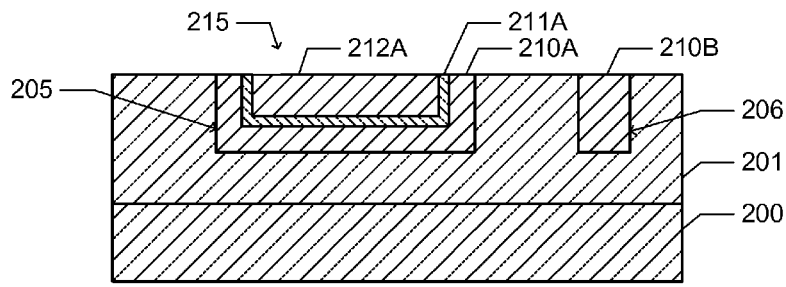

FIG. 15 is a cross sectional view showing a capacitor portion of a semiconductor device of the eighth embodiment. Description will be made by paying attention to different points from the semiconductor device of the fifth embodiment shown in FIGS. 12A and 12B. Description is omitted for the same constituent elements as those of the semiconductor device of the fifth embodiment.

In the fifth embodiment, the surface of the lower conductive film 62 has rounded portions at the intersection between the region in conformity with the bottom surface and the region in conformity with the side surface of the capacitor recess 55. As shown in FIG. 15, depending upon the growth conditions for the lower conductive film 62, a sloped surface is formed on the surface of the lower conductive film 62 at the intersection between the region in conformity with the bottom surface and the side surface of the capacitor recess 55. The sloped surface is formed particularly when the lower conductive film 62 is deposited under the conditions that a narrow via hole is filled with the lower conductive film 62 at good reproductivity.

Also in the case in which the sloped surface is formed, as in the case of the fifth embodiment shown in FIG. 12A, it is preferable that the lower conductive film 62 is formed in such a manner that the upper surface 92 of the lower conductive film 62 is higher than the upper surface of the wiring layer insulating film 53 by 350 to 400 nm or more.

In the above-described embodiments, although the via layer insulating film and wiring layer insulating film constituting the interlayer insulating film are made of $SiO_2$, other insulating material may also be used, such as inorganic insulating materials SiOF, SiN, SiC, SiCN, SiON and the like or low dielectric constant organic insulating materials. Porous insulating materials may also be used. It is preferable to combine these materials and the material of the etching stopper film so as to ensure a sufficient etching selectivity.

The present invention has been described in connection with the preferred embodiments. The invention is not limited only to the above embodiments. It will be apparent to those skilled in the art that other various modifications, improvements, combinations, and the like can be made.

I claim:

1. A method of manufacturing a semiconductor device comprising:
   forming a first interlayer insulating film over a semiconductor substrate;
   forming a capacitor recess and a first via hole in the first interlayer insulating film by etching the first interlayer insulating film using as a mask a first resist pattern which has first openings at positions of the capacitor recess and the first via hole, a bottom of the capacitor recess and a bottom of the first via hole reaching to a bottom surface of the first interlayer insulating film;
   removing the first resist pattern after forming the first via hole and the capacitor recess;
   after removing the first resist pattern, forming a protective member in the first via hole and the capacitor recess, covering the bottom of the first via hole and the bottom of the capacitor recess;
   after forming the protective member, forming a second resist pattern which has a second opening over the first interlayer insulating film;
   after forming the second resist pattern, forming a first wiring trench in the first interlayer insulating film by etching the first interlayer insulating film partway in depth direction thereof using the second resist pattern as a mask, a depth of the first wiring trench being shallower than the first via hole and the capacitor recess, the second opening corresponding to the first wiring trench;
   removing the second resist pattern and the protective member after forming the first wiring trench;
   forming a lower conductive film in the capacitor recess, in the first wiring trench and in the via hole, an upper surface of the lower conductive film located on a part of a bottom of the capacitor recess being lower than the upper surface of the first interlayer insulating film;
   forming a dielectric film over the lower conductive film;
   forming an upper conductive film over the dielectric film;
   removing the lower conductive film, the dielectric film and the upper conductive film disposed above the upper surface of the first interlayer insulating film to pattern a lower electrode, a capacitor dielectric film and an upper electrode of a capacitor in the capacitor recess, the lower electrode, the capacitor dielectric film and the upper electrode being formed of a portion of the lower conductive film, a portion of the dielectric film and a portion of the upper conductive film respectively.

2. The method of manufacturing the semiconductor device according to claim 1, wherein
   the second resist pattern has a third opening including therein the capacitor recess,
   forming the first wiring trench includes forming a wiring layer portion of the capacitor recess which is formed by etching the first interlayer insulating film exposed on a bottom of the third opening including therein the capacitor recess partway in the depth direction of the first interlayer insulating film using the second resist pattern as a mask, and
   the third opening corresponds to the wiring layer portion of the capacitor recess.

3. The method of manufacturing the semiconductor device according to claim 1, wherein the second resist pattern has a third opening included within the capacitor recess, and the protective member is exposed on a bottom of the third opening included within the capacitor recess.

4. The method of manufacturing the semiconductor device according to claim 2, wherein in forming the lower conductive film, the lower conductive film is formed in such a manner that an upper surface of the lower conductive film is higher than the upper surface of the first interlayer insulating film by 350 nm or more, above a portion of a bottom surface of the lead portion of the capacitor.

5. The method of manufacturing the semiconductor device according to claim 1, further comprising:
   forming a barrier metal film which covers inner surfaces of the first wiring trench, the first via hole and the capacitor recess, before forming the lower conductive film, and
   wherein in removing the lower conductive film, the dielectric film and the upper conductive film, the upper conductive film, the barrier metal film, the dielectric film and the lower conductive film are subjected to chemical mechanical polishing under a condition that an exposed polished upper end of the barrier metal film is lower than an exposed polished upper end of the capacitor dielectric film.

6. The method of manufacturing the semiconductor device according to claim 1, further comprising:
   forming a barrier metal film which covers inner surfaces of the first wiring trench, the first via hole and the capacitor recess, before forming the lower conductive film; and
   wherein in removing the lower conductive film, the dielectric film and the upper conductive film, the upper conductive film, the barrier metal film, the dielectric film and the lower conductive film are subjected to chemical mechanical polishing under a condition that an exposed polished surface of the lower conductive film is lower than an exposed polished upper end of the capacitor dielectric film.

7. The method of manufacturing the semiconductor device according to claim 1, wherein at forming the lower conductive film, the lower conductive film is deposited in such condition that a slanted surface is formed on the upper surface of the lower conductive film at a region where a portion formed above the bottom surface of the capacitor recess is connected to a portion formed above a side surface of the capacitor recess.

* * * * *